(12) United States Patent
Yamamoto

(10) Patent No.: US 11,373,988 B2
(45) Date of Patent: Jun. 28, 2022

(54) SEMICONDUCTOR DEVICE

(71) Applicant: FUJI ELECTRIC CO., LTD., Kanagawa (JP)

(72) Inventor: Sayaka Yamamoto, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 95 days.

(21) Appl. No.: 16/882,548

(22) Filed: May 25, 2020

(65) Prior Publication Data

US 2020/0286877 A1 Sep. 10, 2020

Related U.S. Application Data

(63) Continuation of application No. PCT/JP2019/017815, filed on Apr. 25, 2019.

(30) Foreign Application Priority Data

Jun. 1, 2018 (JP) .............................. JP2018-106515

(51) Int. Cl.
| | |
|---|---|
| *H01L 23/48* | (2006.01) |
| *H01L 25/18* | (2006.01) |
| *H01L 23/538* | (2006.01) |
| *H02M 7/00* | (2006.01) |
| *H02M 7/537* | (2006.01) |
| *H01L 23/373* | (2006.01) |

(52) U.S. Cl.
CPC .......... *H01L 25/18* (2013.01); *H01L 23/5386* (2013.01); *H02M 7/003* (2013.01); *H02M 7/537* (2013.01); *H01L 23/3735* (2013.01)

(58) Field of Classification Search
None
See application file for complete search history.

(56) References Cited

U.S. PATENT DOCUMENTS

| | | | |
|---|---|---|---|
| 6,353,258 B1 | 3/2002 | Inoue | |
| 9,209,137 B2 * | 12/2015 | Vu | .......................... H01L 21/78 |

(Continued)

FOREIGN PATENT DOCUMENTS

| | | | |
|---|---|---|---|
| JP | H07249735 A | 9/1995 | |
| JP | H08195471 A | 7/1996 | |

(Continued)

OTHER PUBLICATIONS

International Search Report and (ISA/237) Written Opinion of the International Search Authority for International Patent Application No. PCT/JP2019/017815, mailed by the Japan Patent Office dated Jun. 18, 2019.

*Primary Examiner* — Hung K Vu

(57) ABSTRACT

A semiconductor device with reduced variation in the resistance values of the current paths is provided. A semiconductor device including a first circuit block having a plurality of first circuit portions connected in parallel, a second circuit block having a plurality of second circuit portions connected in parallel, and an interblock connection portion electrically connecting the first circuit block and the second circuit block is provided. The interblock connection portion has a resistance adjusting portion that increases a resistance value in a current path from the first circuit block to a second circuit portion arranged closest to the first circuit block in the second circuit block.

20 Claims, 18 Drawing Sheets

(56) References Cited

U.S. PATENT DOCUMENTS

| | | | |
|---|---|---|---|
| 9,495,498 B2 * | 11/2016 | Bartley | .............. H01L 25/0657 |
| 10,002,858 B2 | 6/2018 | Masuda | |
| 2015/0155797 A1 | 6/2015 | Okayama | |
| 2015/0270786 A1 | 9/2015 | Chen | |

FOREIGN PATENT DOCUMENTS

| | | | |
|---|---|---|---|
| JP | 2000060126 A | 2/2000 | |
| JP | 2002125381 A | 4/2002 | |
| JP | 2002353407 A | 12/2002 | |
| JP | 2016009496 A1 | 4/2017 | |
| JP | 2017118816 A | 6/2017 | |
| WO | 2013179547 A1 | 12/2013 | |
| WO | 2014192118 A1 | 12/2014 | |

\* cited by examiner

SEMICONDUCTOR DEVICE

The contents of the following Japanese patent applications are incorporated herein by reference:
NO. 2018-106515 filed in JP on Jun. 1, 2018, and
NO. PCT/JP2019/017815 filed on Apr. 25, 2019.

BACKGROUND

1. Technical Field

The present invention relates to semiconductor devices.

2. Related Art

Conventionally, semiconductor devices having a plurality of semiconductor chips, in which current flows through each of the plurality of semiconductor chips are known (See Patent Document 1, for example).
Patent Document 1: Japanese Translation of PCT International Application Publication No. 2016-9496

In semiconductor devices, imbalance of the current flowing through each of the plurality of semiconductor chips is preferably eliminated.

GENERAL DISCLOSURE

In a first aspect of the present invention, a semiconductor device is provided. The semiconductor device may include a first circuit block having a plurality of first circuit portions connected in parallel. The semiconductor device may include a second circuit block having a plurality of second circuit portions connected in parallel. The semiconductor device may include an interblock connection portion electrically connecting the first circuit block and the second circuit block. The interblock connection portion may have a resistance adjusting portion that increases a resistance value in a current path from the first circuit block to a second circuit portion arranged closest to the first circuit block in the second circuit block.

The plurality of first circuit portions may be arranged side by side in a first direction. The plurality of second circuit portions may be arranged side by side in the first direction. The first circuit block and the second circuit block may be arranged side by side in the first direction.

The resistance adjusting portion may increase a resistance value in a current path from the second circuit block to a first circuit portion arranged closest to the second circuit block in the first circuit block.

The interblock connection portion may have a plate portion. The resistance adjusting portion may be a slit provided on the plate portion.

The interblock connection portion may have a first connection end provided for each of the first circuit portions, which protrudes from an edge of the plate portion to be connected to one of the first circuit portions. The interblock connection portion may have a second connection end provided for each of the second circuit portions, which protrudes from the edge of the plate portion to be connected to one of the second circuit portions. The resistance adjusting portion may have an edge slit provided between the first connection end arranged closest to the second connection end and the second connection end arranged closest to the first connection end, which extends from the edge to an interior of the plate portion, on the edge of the plate portion. The resistance adjusting portion may have a first inner slit connected to the edge slit in the plate portion, which extends towards the first connection end along the edge. The resistance adjusting portion may have a second inner slit connected to the edge slit in the plate portion, which extends towards the second connection end along the edge.

The first inner slit may extend outward beyond at least one of the first connection ends. The second inner slit may extend outward beyond at least one of the second connection ends.

The semiconductor device may include a third circuit block arranged side by side with the second circuit block in a second direction perpendicular to the first direction and electrically connected to the second circuit block. The semiconductor device may include a fourth circuit block arranged side by side with the first circuit block in the second direction and side by side with the third circuit block in the first direction, which is electrically connected to the first circuit block. The third circuit block may have a plurality of third circuit portions electrically connected in parallel and arranged side by side in the first direction. The fourth circuit block may have a plurality of fourth circuit portions electrically connected in parallel and arranged side by side in the first direction.

The semiconductor device may include a first intrablock connection portion electrically connected to the third circuit block. The first intrablock connection portion may have a plate portion on which a slit is provided. The first intrablock connection portion may have an external connection end protruding from the plate portion. The first intrablock connection portion may have a third connection end provided for each of the third circuit portions, which protrudes from an edge of the plate portion to be connected to one of the third circuit portions. A slit may be provided such that the slit traverses a straight line that links a third connection end, among the third connection ends, arranged closest to the fourth circuit block with the external connection end.

The semiconductor device may include a second intrablock connection portion electrically connected to the fourth circuit block. The second intrablock connection portion may include a plate portion. The second intrablock connection portion may include an external connection end protruding from the plate portion. The second intrablock connection portion may have a fourth connection end provided for each of the fourth circuit portions, which protrudes from an edge of the plate portion to be connected to one of the fourth circuit portions. The external connection end of the first intrablock connection portion may be arranged to be closer to the fourth circuit block than the center of the plate portion in the first direction. The external connection end of the second intrablock connection portion may be arranged to be farther from the third circuit block than the center of the plate portion in the first direction. The plate portion of the second intrablock connection portion may not have a slit provided thereon, which traverses straight lines each linking the respective fourth connection ends with the external connection end.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention, but the following embodiments do not limit the invention according to the claims. In addition, not all combinations of features described in the embodiments are necessarily essential to the solution of the invention.

In this specification, one side in a direction parallel to the depth direction of the semiconductor substrate that the semiconductor chip has is referred to as "upper", and the other side is referred to as "lower". One of two main surfaces of a substrate, a layer or some other member is referred to as an upper surface, and the other surface is referred to as a lower surface. The "upper", "lower", "front", and "back" directions are not limited to the gravitational direction or the direction of attachment to a substrate or the like at the time of implementation of a semiconductor device.

In this specification, technical matters may be described using orthogonal coordinate axes of X-axis, Y-axis and Z-axis. In this specification, a surface parallel to the upper surface of a semiconductor chip is referred to as an XY-plane, and an axis perpendicular to the XY-plane is referred to as a Z-axis.

In addition, in this specification, distances, resistance values, current sizes or the like may be described as being equal. Cases where they are equal are not limited to cases where they are identical, and they may be different within the scope of the invention described herein. For example, being equal allows errors within 10%.

Figure 1:
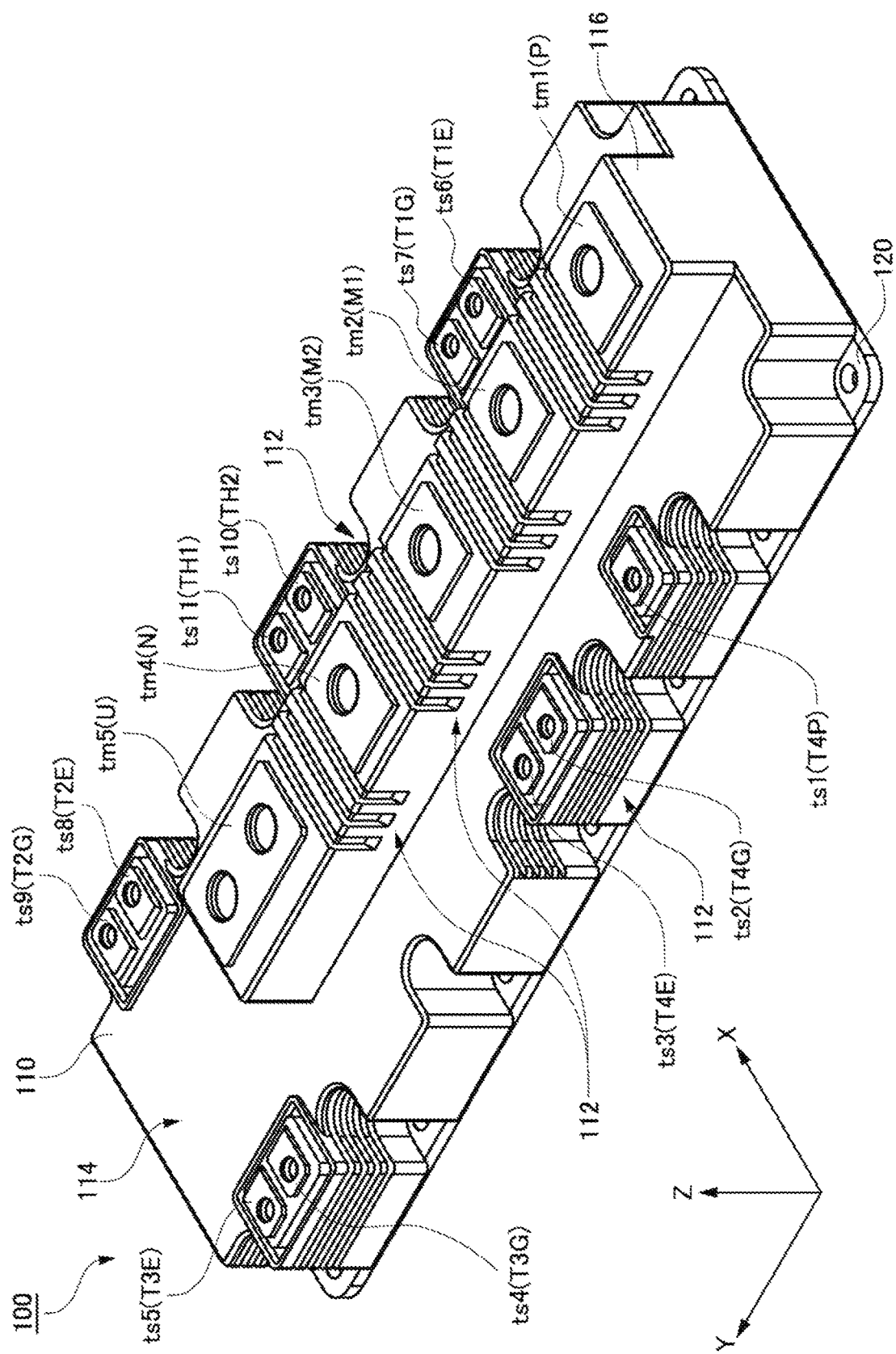
FIG. 1 shows an example of a perspective view of a semiconductor device 100 according to one example of the present invention.

FIG. 1 shows an example of a perspective view of a semiconductor device 100 according to one example of the present invention. The semiconductor device 100 includes a casing portion 110, a base portion 120, and a plurality of terminals. In one example, the semiconductor device 100 is used in a power conditioner (PCS: Power Conditioning Subsystem).

The casing portion 110 accommodates an internal circuit such as a semiconductor chip and wiring. The casing portion 110 is formed of insulative resin. The casing portion 110 is provided on the base portion 120. The casing portion 110 may be provided with a notch portion 112 to increase the creepage distance to enhance insulation.

The base portion 120 is fixed to the casing portion 110 with an adhesive or the like on the upper-surface side. The base portion 120 may be set to the ground potential. The base portion may be fixed to a heat dissipating member such as a fin with a screw or the like, on the lower surface side. The base portion 120 has a main surface in the XY-plane. The base portion 120 and the casing portion 110 may have two sets of opposing edges, as seen in an upper surface view from the Z-axis direction. The base portion 120 and the casing portion 110 of the present example have longer edges along the Y-axis, and have shorter edges along the X-axis.

A terminal arrangement surface 114 is a surface on which the plurality of terminals is exposed in the upper-surface side of the casing portion 110. Each terminal electrically connects the internal circuit accommodated in the casing portion 110 to an external device. The first auxiliary terminal ts1 to the eleventh auxiliary terminal ts11 are provided on the terminal arrangement surface 114. The terminal arrangement surface 114 has a convex portion 116 protruding in the Z-axis direction.

The convex portion 116 is provided near the center of the terminal arrangement surface 114, as seen in an upper surface view. The convex portion 116 of the present example is arranged extending along the Y-axis direction at the center in the X-axis direction of the terminal arrangement surface 114. A first external connection terminal tm1 to a fifth external connection terminal tm5 are provided on the convex portion 116. The first external connection terminal tm1 to the fifth external connection terminal tm5 are arranged in order along the Y-axis direction in the convex portion 116, but the arrangement of the external connection terminals is not limited thereto.

The first external connection terminal tm1 (P) is a terminal to which a positive terminal of a direct power supply provided external to the semiconductor device 100 is connected. The fourth external connection terminal tm4 (N) is a terminal to which a negative terminal of the external direct power supply is connected. The first external connection terminal tm1 (P) and the fourth external connection terminal tm4 (N) function as power supply terminals P, N in the internal circuit of the semiconductor device 100.

The fifth external connection terminal tm5 (U) functions as an AC output terminal U in the internal circuit of the semiconductor device 100. The second external connection terminal tm2 (M1) and the third external connection terminal tm3 (M2) are connected to predetermined connection points in the internal circuit of the semiconductor device 100. For example, the second external connection terminal tm2 (M1) and the third external connection terminal tm3 (M2) function as intermediate terminals M1, M2 which clamp the voltage of the predetermined connection points in the internal circuit of the semiconductor device 100.

The first auxiliary terminal ts1 to the fifth auxiliary terminal ts5 are arranged along one edge (the longer edge in the present example) along the Y-axis of the terminal arrangement surface 114. The sixth auxiliary terminal ts6 to the eleventh auxiliary terminal ts11 are arranged along the other edge along the Y-axis direction of the terminal arrangement surface 114.

The first auxiliary terminal ts1 (T4P) outputs a collector voltage of a transistor T4 described below. The second auxiliary terminal ts2 (T4G) is a gate terminal supplying a gate voltage of the transistor T4. The third auxiliary terminal ts3 (T4E) outputs an emitter voltage of the transistor T4.

The fourth auxiliary terminal ts4 (T3G) is a gate terminal supplying a gate voltage of a transistor T3 described below. The fifth auxiliary terminal ts5 (T3E) outputs an emitter voltage of the transistor T3.

The sixth auxiliary terminal ts6 (T1E) outputs an emitter voltage of a transistor T1 described below. The seventh auxiliary terminal ts7 (T1G) is a gate terminal supplying a gate voltage of the transistor T1.

The eighth auxiliary terminal ts8 (T2E) outputs an emitter voltage of a transistor T2 described below. The ninth auxiliary terminal ts9 (T2G) is a gate terminal supplying a gate voltage of the transistor T2.

The tenth auxiliary terminal ts10 (TH2) and the eleventh auxiliary terminal ts11 (TH1) are terminals for thermistors, which are connected to a thermistor to detect the internal temperature of the casing portion 110. For example, the thermistor is embedded in the casing portion 110 under the tenth auxiliary terminal ts10 (TH2) and the eleventh auxiliary terminal ts11 (TH1).

First Example

Figure 2:
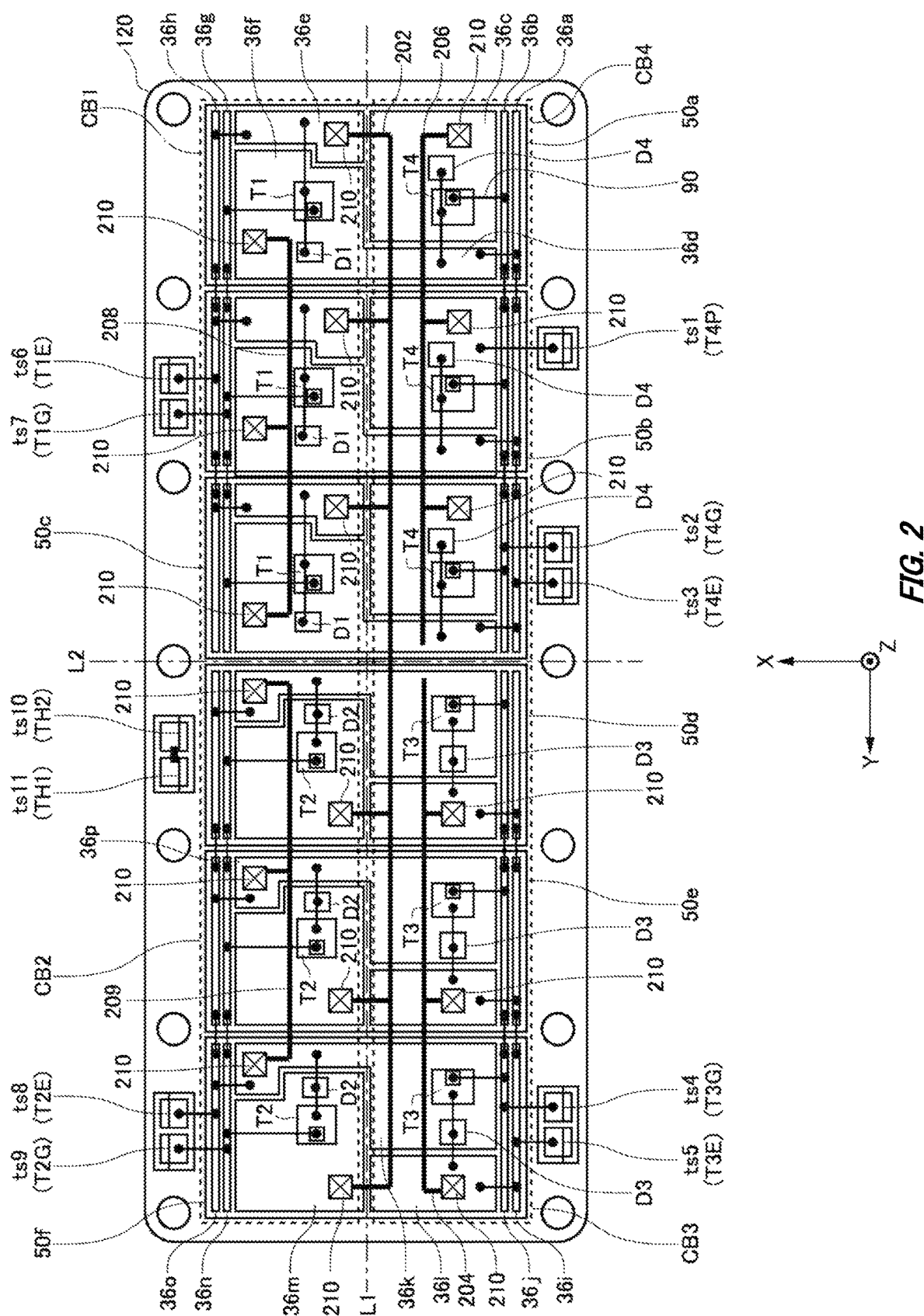
FIG. 2 is an example of a plan view of the semiconductor device 100 according to the first example.

FIG. 2 is an example of a plan view of the semiconductor device 100 according to the first example. This figure shows an exemplary arrangement of an internal circuit provided on a base portion 120, in the interior of a casing portion 110. The internal circuit of the present example is a three-level power conversion device (an inverter) circuit, but the internal circuit is not limited thereto.

The semiconductor device 100 of the present example includes six insulating substrates 50*a*-50*f* on the base portion 120. These six insulating substrates 50*a*, 50*b*, 50*c*, 50*d*, 50*e*, 50*f* of the present example are arranged side by side along the Y-axis direction in this order. The insulating substrates 50 are bonded to the base portion 120. The insulating substrates 50 includes conductivity patterns on both sides of ceramic (alumina, for example) substrates having high heat-conductivity. For example, the insulating substrates 50 are DCB (Direct Copper Bonding) substrates that have copper circuit boards directly bonded to ceramic substrates.

One or more transistors T may be arranged on each of the insulating substrates 50. Each of the transistors T may be an insulated gate bipolar transistor (IGBT) or a field effect transistor (FET). FIG. 2 shows a semiconductor chip with the transistors T provided thereon. The semiconductor device 100 of the present example includes a plurality of transistors connected to each other in parallel. In the example shown in FIG. 2, three transistors T1 are connected in parallel. Similarly, three transistors T2 are connected in parallel, three transistors T3 are connected in parallel, and three transistors T4 are connected in parallel. In this specification, a plurality of transistors Tk (k is an integer) connected in parallel may be collectively referred to as the transistor Tk.

A plurality of transistors Tk connected in parallel may be arranged side by side along a predetermined first direction (Y-axis direction in FIG. 2). In the present example, the plurality of transistors T1 and the plurality of transistors T2 are arranged side by side along one of the longer edges of the base portion 120, and the plurality of transistors T3 and the plurality of transistors T4 are arranged side by side along the other longer edge of the base portion 120.

In addition, the transistors T1 and T4 may be implemented on the same insulating substrate 50. The transistors T2 and T3 may be implemented on the same insulating substrate 50. The insulating substrates 50*a*-50*c* are insulating substrates each having the transistors T4 and T1 implemented thereon. The insulating substrates 50*d*-50*f* are insulating substrates each having the transistors T3 and T2 implemented thereon.

In addition, each of the insulating substrates 50 may be provided with diodes Dk. The diodes Dk may be Free Wheel Diodes connected to the transistors Tk in reverse parallel. Although diodes Dk are provided for each of the transistors Tk in the present example, diodes Dk may be provided for some of the transistors Tk in other examples. In addition, although the transistors and the diodes of the present example are each provided on separate semiconductor chips, they may be a reverse conducting IGBT (RC-IBGT) or the like with transistors and diodes provided on a same semiconductor chip.

In the present example, the region on which the insulating substrates 50 are provided is divided into four circuit blocks CB1-CB4, as seen in an upper surface view. The first circuit block CB1 is a region on which the plurality of transistors T1 provided in parallel is provided, the second circuit block CB2 is a region on which the plurality of transistors T2 provided in parallel is provided, the third circuit block CB3 is a region on which the plurality of transistors T3 provided in parallel is provided, and the fourth circuit block CB4 is a region on which the plurality of transistors T4 provided in parallel is provided. Each of the circuit blocks CBk may be provided with the diodes Dk.

The circuit blocks CB1-CB4 of the present example are divided by virtual centerlines L1 and L2. The centerline L2 divides the base portion 120 into a region on which the insulating substrates 50*a*, 50*b*, and 50*c* are provided and a region on which the insulating substrates 50*d*, 50*e*, and 50*f* are provided. The centerline L2 of the present example is a straight line parallel to the X-axis that runs between the insulating substrate 50*c* and the insulating substrate 50*d*.

The centerline L1 divides the insulating substrates 50*a*, 50*b*, and 50*c* into a region on which the plurality of transistors T1 is provided, and a region on which the plurality of transistors T4 is provided. In addition, the centerline L1 divides the insulating substrates 50*d*, 50*e*, and 50*f* into a region on which the plurality of transistors T2 is provided and a region on which the plurality of transistors T3 is provided. The centerline L1 of the present example is a straight line parallel to the Y-axis that runs through the center in the X-axis direction of a region on which the insulating substrates 50 are provided.

The semiconductor device 100 has a plurality of conductivity patterns 36 provided on the insulating substrates 50. The conductivity patterns 36 are formed of conductive materials such as copper. In addition, the semiconductor device 100 has a plurality of connection members 90 that electrically connects each member in the internal circuit. The connection members 90 are wiring provided over the insulating substrates 50, such as wires or lead frames, for example. In FIG. 2, the connection members 90 are shown with solid lines. In addition, the connection points of the connection members 90 and other members are shown with filled circles. The connection members 90 are connected to other members at the connection points by means of direct bonding, soldering or the like.

In each of the insulating substrates 50*a*-50*c*, a conductivity pattern 36*a* is provided at one end in the X-axis direction. The conductivity pattern 36*a* electrically connects an emitter pad of the corresponding transistor T4 and an anode pad of the diode D4 to a third auxiliary terminal ts3 (T4E).

In each of the insulating substrates 50*a*-50*c*, a conductivity pattern 36*b* is provided at one end in the X-axis direction. The conductivity pattern 36*b* electrically connects a gate pad of the corresponding transistor T4 to a second auxiliary terminal ts2 (T4G). The conductivity patterns 36*a* and 36*b* of the present example are wiring arranged in the fourth circuit block CB4 and having a longitudinal side in the Y-axis direction.

A conductivity pattern 36*c* is provided on each of the insulating substrates 50*a*-50*c*. The conductivity pattern 36*c* of the present example has the transistor T4 and the diode D4 provided thereon. The conductivity pattern 36*c* is connected to a collector electrode of the transistor T4 and a cathode electrode of the diode D4, via soldering or the like. In addition, each of the conductivity patterns 36*c* is electrically connected to the first auxiliary terminal ts1 (T4P).

A conductivity pattern 36*d* is provided on each of the insulating substrates 50*a*-50*c*. The conductivity pattern 36*d* of the present example electrically connects an emitter pad of the transistor T4 and an anode pad of the diode D4 to the conductivity pattern 36*a*. The conductivity patterns 36*c* and 36*d* are arranged in the fourth circuit block CB4.

In each of the insulating substrates 50*a*-50*c*, a conductivity pattern 36*h* is provided at one end in the X-axis direction. The conductivity pattern 36*h* electrically connects an emitter pad of the corresponding transistor T1 and an anode pad of the diode D1 to a sixth auxiliary terminal ts6 (T1E).

In each of the insulating substrates 50*a*-50*c*, a conductivity pattern 36*g* is provided at one end in the X-axis direction. The conductivity pattern 36*g* electrically connects a gate pad of the corresponding transistor T1 to a seventh auxiliary terminal ts7 (T1G). The conductivity patterns 36*h* and 36*g* of the present example are wiring arranged in the first circuit block CB1 and having a longitudinal side in the Y-axis direction.

The conductivity pattern 36*f* is provided on each of the insulating substrates 50*a*-50*c*. The conductivity pattern 36*f* of the present example has the transistor T1 and the diode D1 provided thereon. The conductivity pattern 36*f* is connected to a collector electrode of the transistor T1 and a cathode electrode of the diode D1, via soldering or the like. The conductivity pattern 36*f* of the present example and the conductivity pattern 36*d* are provided in series. In this manner, the collector pad of the transistor T1 and the emitter pad of the transistor T4 are electrically connected to each other.

The conductivity pattern 36*e* is provided on each of the insulating substrates 50*a*-50*c*. The conductivity pattern 36*e* of the present example electrically connects an emitter pad of the transistor T1 and an anode pad of the diode D1 to the conductivity pattern 36*h*. The conductivity patterns 36*f* and 36*e* are arranged in the first circuit block CB1.

In each of the insulating substrates 50*d*-50*f*, a conductivity pattern 36*i* is provided at one end in the X-axis direction. The conductivity pattern 36*i* electrically connects an emitter pad of the corresponding transistor T3 and an anode pad of the diode D3 to a fifth auxiliary terminal ts5 (T3E).

In each of the insulating substrates 50*d*-50*f*, a conductivity pattern 36*j* is provided at one end in the X-axis direction. The conductivity pattern 36*j* electrically connects a gate pad of the corresponding transistor T3 to a fourth auxiliary terminal ts4 (T3G). The conductivity patterns 36*i* and 36*j* of the present example are wiring arranged in the third circuit block CB3 and having a longitudinal side in the Y-axis direction.

The conductivity pattern 36*k* is provided on each of the insulating substrates 50*d*-50*f*. The conductivity pattern 36*k* of the present example has the transistor T3 and the diode D3 provided thereon. The conductivity pattern 36*k* is connected to a collector electrode of the transistor T3 and a cathode electrode of the diode D3, via soldering or the like.

The conductivity pattern 36*l* is provided on each of the insulating substrates 50*d*-50*f*. The conductivity pattern 36*l* of the present example electrically connects an emitter pad of the transistor T3 and an anode pad of the diode D3 to the conductivity pattern 36*i*. The conductivity patterns 36*k* and 36*l* are arranged in the third circuit block CB3.

In each of the insulating substrates 50*d*-50*f*, a conductivity pattern 36*o* is provided at one end in the X-axis direction. The conductivity pattern 36*o* electrically connects an emitter pad of the corresponding transistor T2 and an anode pad of the diode D2 to an eighth auxiliary terminal ts8 (T2E).

In each of the insulating substrates 50*d*-50*f*, a conductivity pattern 36*n* is provided at one end in the X-axis direction. The conductivity pattern 36*n* electrically connects a gate pad of the corresponding transistor T2 to a ninth auxiliary terminal ts9 (T2G). The conductivity patterns 36*o* and 36*n* of the present example are wiring arranged in the second circuit block CB2 and having a longitudinal side in the Y-axis direction.

The conductivity pattern 36*m* is provided on each of the insulating substrates 50*d*-50*f*. The conductivity pattern 36*m* of the present example has the transistor T2 and the diode D2 provided thereon. The conductivity pattern 36*m* is connected to a collector electrode of the transistor T2 and a cathode electrode of the diode D2, via soldering or the like.

The conductivity pattern 36*p* is provided on each of the insulating substrates 50*d*-50*f*. The conductivity pattern 36*p* of the present example electrically connects an emitter pad of the transistor T2 and an anode pad of the diode D2 to the conductivity pattern 36*o*. The conductivity patterns 36*m* and 36*p* are arranged in the second circuit block CB2. The conductivity pattern 36*p* of the present example and the conductivity pattern 36*k* are provided in series. In this manner, the collector pad of the transistor T3 and the emitter pad of the transistor T2 are electrically connected to each other.

The semiconductor device 100 of the present example includes a interblock connection portion 202, a first intrablock connection portion 204, a second intrablock connection portion 206, a third intrablock connection portion 208, and a fourth intrablock connection portion 209. The interblock connection portion 202 electrically connects two circuit blocks CB. The interblock connection portion 202 of the present example electrically connects the first circuit block CB1 and the second circuit block CB2.

The interblock connection portion 202 is electrically connected to any of the circuit devices in each circuit block CB. The interblock connection portion 202 of the present example is connected to the plurality of conductivity patterns 36*e* on the first circuit block CB1 and the plurality of conductivity patterns 36*m* on the second circuit block CB2.

Each of the intrablock connection portions is electrically connected to a plurality of circuit devices within one circuit block CB. The first intrablock connection portion 204 of the present example is connected to the plurality of conductivity patterns 36*l* on the third circuit block CB3. The second intrablock connection portion 206 of the present example is connected to the plurality of conductivity patterns 36c on the fourth circuit block CB4. The third intrablock connection portion 208 of the present example is connected to the plurality of conductivity patterns 36f on the first circuit block CB1. The fourth intrablock connection portion 209 of the present example is connected to the plurality of conductivity patterns 36p on the second circuit block CB2.

The interblock connection portion 202 and the intrablock connection portions may be plate-like conductive members arranged over the insulating substrate 50. At least some of the plate portion of the interblock connection portion 202 and the intrablock connection portions may be arranged perpendicular to the insulating substrate 50. The interblock connection portion 202 and the intrablock connection portions may be formed of conductive materials such as copper, aluminum or the like. In FIG. 2, the regions to be connected to the interblock connection portion 202 or the intrablock connection portions in each of the conductivity patterns 36 are shown as connection regions 210.

Figure 3:
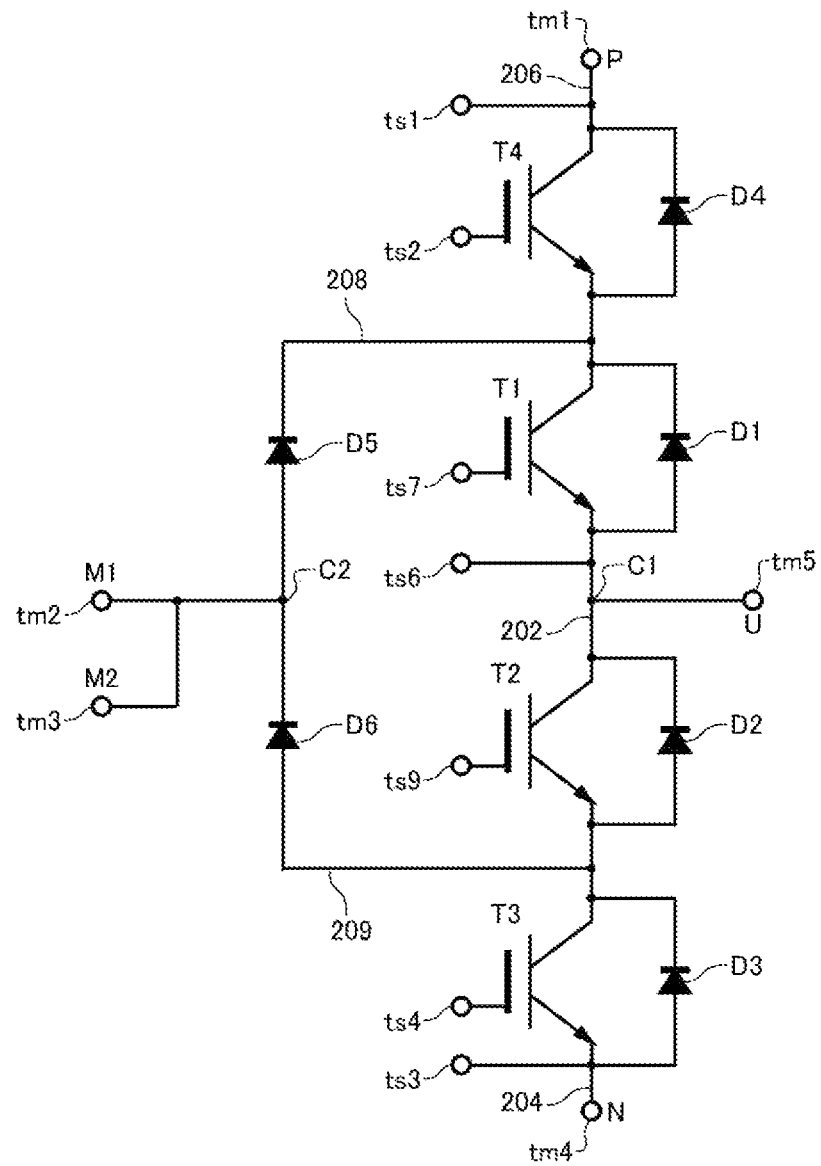
FIG. 3 shows an example of a circuit configuration in an internal circuit of the semiconductor device 100.

FIG. 3 shows an example of a circuit configuration in an internal circuit of the semiconductor device 100. The internal circuit of the present example is a circuit with one phase (U-phase) of the three phases (the U-phase, the V-phase, and the W-phase) of a three-level power conversion (inverter) circuit.

The transistor T4, the transistor T1, the transistor T2, and the transistor T3 are connected in series in this order between the first external connection terminal tm1 (P) and the fourth external connection terminal tm4 (N). Each of the transistors Tk includes a plurality of transistors connected in parallel, as described in FIG. 2, but is shown as one transistor in the circuit in FIG. 3. For example, the plurality of transistors T4 is connected to each other in parallel, the plurality of transistors T1 is connected to each other in parallel, and the plurality of transistors T4 and the plurality of transistors T1 are connected in series. The diodes Dk are connected to each of the transistors Tk in reverse parallel.

The connection point between an emitter terminal of the transistor T1 and a collector terminal of the transistor T2 is assumed as the connection point C1. The connection point C1 is connected to the fifth external connection terminal tm5 (U) as an AC output terminal.

A collector terminal of the transistor T1 and an emitter terminal of the transistor T2 are connected via two diodes D5, D6 provided in series. The diodes D5 and D6 are arranged so that the direction from the emitter terminal of the transistor T2 towards the collector terminal of the transistor T1 is a forward direction. Note that, the diodes D5, D6 are omitted in FIG. 2. The diodes D5, D6 may be provided on the conductivity pattern 36, may be provided at the third intrablock connection portion 208 or the fourth intrablock connection portion 209, or may be provided at other locations.

The connection point between the diodes D5 and D6 is assumed as the connection point C2. The connection point C2 is connected to the second external connection terminal tm2 (M1) and the third external connection terminal tm3 (M2). Such a configuration allows the internal circuit to operate as an I-type three-level power conversion circuit in which four transistors T are connected in series.

Figure 4A:
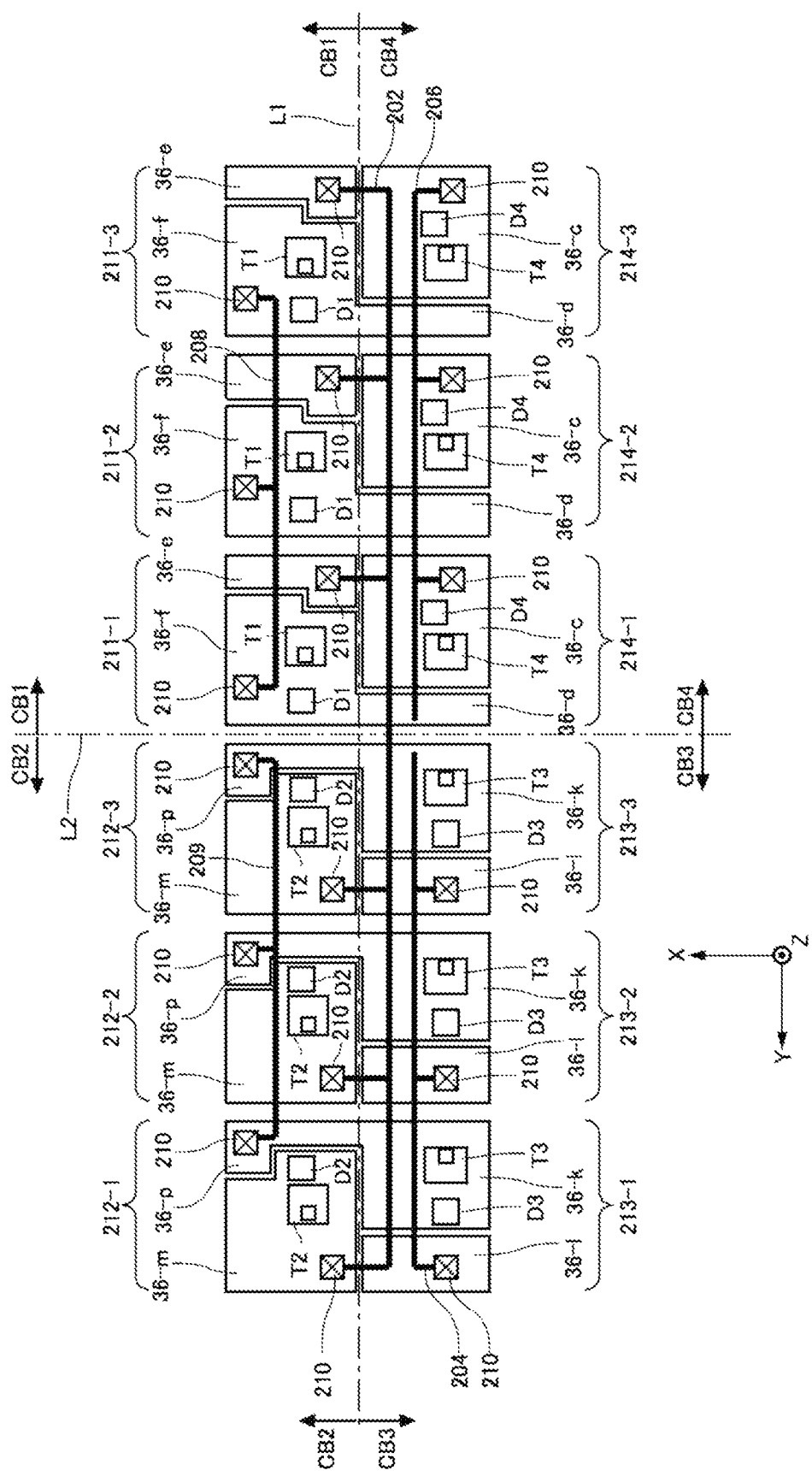
FIG. 4A describes a summary of each of the circuit blocks CB.

FIG. 4A describes a summary of each of the circuit blocks CB. The first circuit block CB1 has a plurality of first circuit portions 211 connected in parallel. Each of the first circuit portions 211 of the present example includes a conductivity pattern 36-e and a conductivity pattern 36-f, and the transistor T1 and the diode D1 that are arranged on these conductivity patterns.

The second circuit block CB2 has a plurality of second circuit portions 212 connected in parallel. Each of the second circuit portions 212 of the present example includes a conductivity pattern 36-m and a conductivity pattern 36-p, and the transistor T2 and the diode D2 that are arranged on these conductivity patterns.

The third circuit block CB3 has a plurality of third circuit portions 213 connected in parallel. Each of the third circuit portions 213 of the present example includes a conductivity pattern 36-k and a conductivity pattern 36-l, and the transistor T3 and the diode D3 that are arranged on these conductivity patterns.

The fourth circuit block CB4 has a plurality of fourth circuit portions 214 connected in parallel. Each of the fourth circuit portions 214 of the present example includes a conductivity pattern 36-c and a conductivity pattern 36-d, and the transistor T4 and the diode D4 that are arranged on these conductivity patterns.

The first circuit block CB1 and the second circuit block CB2 of the present example are arranged side by side along a first direction (Y-axis direction). Similarly, the third circuit block CB3 and the fourth circuit block CB4 are arranged side by side along the first direction (Y-axis direction). In addition, the first circuit block CB1 and the fourth circuit block CB4 are arranged side by side in a second direction (X-axis direction). Similarly, the second circuit block CB2 and the third circuit block CB3 are arranged side by side in the second direction (X-axis direction). Note that, as shown in FIG. 2, in the present example, the first direction (Y-axis direction) is a direction parallel to the longer edge of the base portion 120. In addition, in the present example, the second direction (X-axis direction) is a direction parallel to the shorter edge of the base portion 120.

In addition, the plurality of circuit portions in each of the circuit blocks CB are arranged side by side along the first direction (Y-axis direction). For example, the first circuit portions 211-1, 211-2, 211-3 are arranged side by side along the first direction. Note that, that the circuit portions are arranged side by side along the first direction means that the location of each of the circuit portions in the first direction is different. In a direction perpendicular to the first direction (X-axis direction in the present example), each circuit portion may or may not be arranged at the same location. Each circuit portion may have portions overlapping with a straight line that is parallel to the first direction.

As described above, the interblock connection portion 202 connects the first circuit block CB1 to the second circuit block CB2. That is, the interblock connection portion 202 connects each of the plurality of first circuit portions 211 to each of the plurality of second circuit portions 212.

Figure 4B:
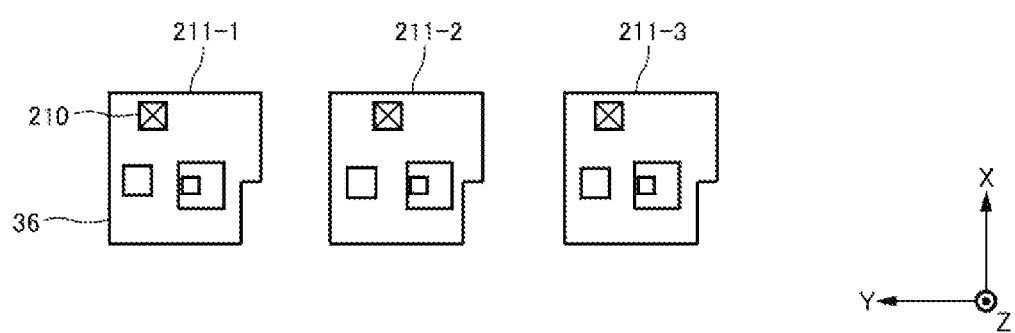
FIG. 4B shows an example of first circuit portions 211 arranged side by side along a first direction.

FIG. 4B shows an example of first circuit portions 211 arranged side by side along a first direction. The location of each of the first circuit portions 211 in the first direction (Y-axis) is different. Note that, the center of gravity of the shape in the XY-plane of the conductivity pattern on which the connection region 210 is provided may be used as the location of each of the first circuit portions 211. In the present example, the location of each of the first circuit portions 211 in the X-axis is identical.

Figure 4C:
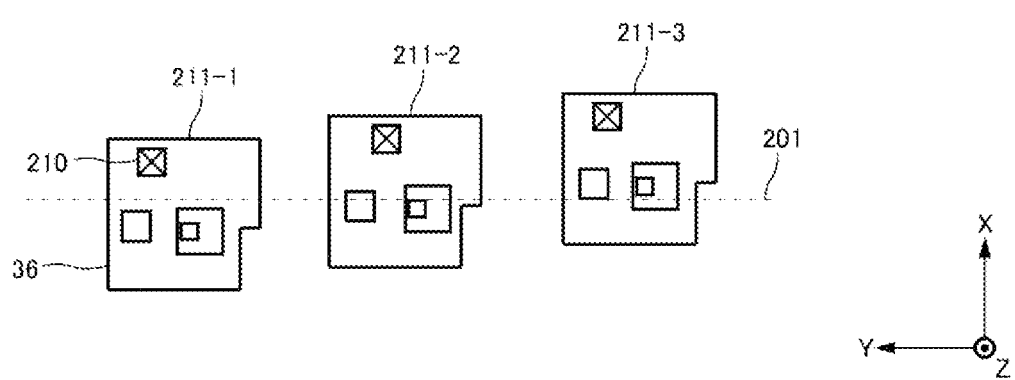
FIG. 4C shows another example of the first circuit portions 211 arranged side by side along the first direction.

FIG. 4C shows another example of the first circuit portions 211 arranged side by side along the first direction. The location of each of the first circuit portions 211 in the first direction (Y-axis) is different, in the present example as well. In the present example, each of the first circuit portions 211 is arranged at different locations in the X-axis direction. Such a form is also included as those arranged side by side along the first direction herein. Note that, each of the first circuit portions 211 of the present example is arranged so that a straight line 201 parallel to the first direction that passes through the conductivity patterns 36 of the first circuit portions 211 exists. In other examples, at least one of the first circuit portions 211 may be arranged so that the conductivity patterns 36 do not overlap with the straight line 201.

Figure 4D:
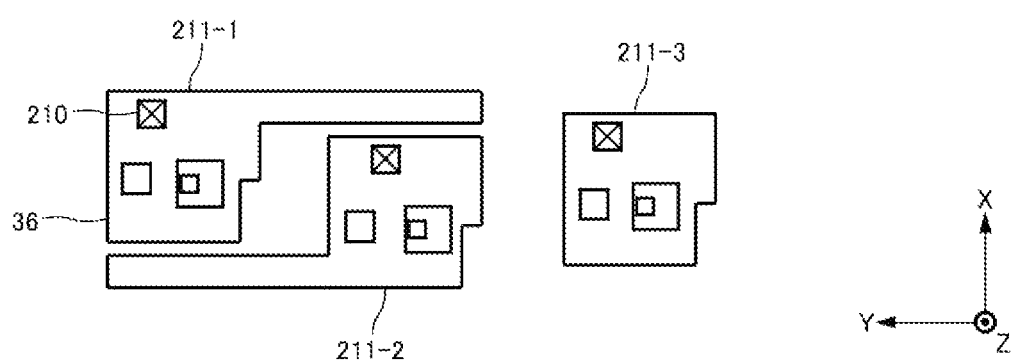
FIG. 4D shows another example of the first circuit portions 211 arranged side by side along the first direction.

FIG. 4D shows another example of the first circuit portions 211 arranged side by side along the first direction. The location of each of the first circuit portions 211 in the first direction (Y-axis) is different, in the present example as well. In the present example, at least one of the first circuit portions 211 have a portion that overlaps with other ones of the first circuit portions 211 in the X-axis direction. Such a form is also included as those arranged side by side along the first direction herein.

FIGS. 4B-4D are described using the first circuit portions 211, but the same applies to other circuit portions. In addition, the same applies to the circuit blocks CB. FIGS. 4B-4D describes a situation in which the circuit blocks CB are arranged side by side in the first direction, but the same applies to situations in which they are arranged side by side in other directions.

Figure 5:
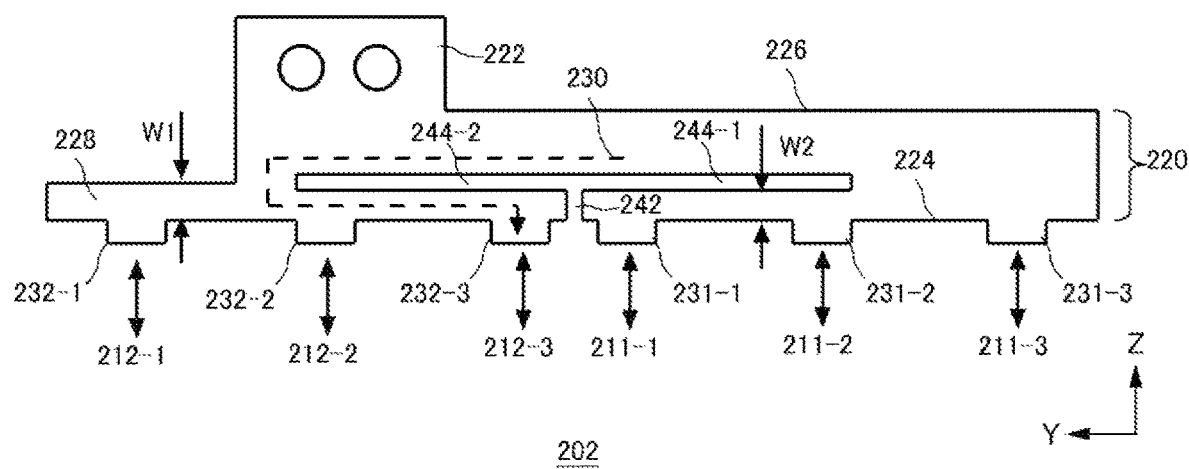
FIG. 5 shows an exemplary shape of an interblock connection portion 202.

FIG. 5 shows an exemplary shape of an interblock connection portion 202. The interblock connection portion 202 has a plate portion 220, a plurality of first connection ends 231, and a plurality of second connection ends 232. The plate portion 220 may be a plate member that extends from above the first circuit portion 211-3 arranged at one end to above the second circuit portion 212-1 arranged at the other end, among the plurality of first circuit portions 211 and the plurality of second circuit portions 212 arranged side by side in the Y-axis direction. The plate portion 220 may be provided perpendicular to the XY-plane. The plate portion 220 has an edge 224 opposing the circuit block CB, and an edge 226 on a side opposite to the edge 224.

The first connection ends 231 are provided for each of the first circuit portions 211. The first connection ends 231 protrude from the edge 224 of the plate portion 220 towards the first circuit portions 211, and are connected to the first circuit portions 211 at the connection regions 210. The second connection ends 232 are provided for each of the second circuit portions 212. The second connection ends 232 protrude from the edge 224 of the plate portion 220 towards the second circuit portions 212, and are connected to the second circuit portions 212 at the connection regions 210. In FIG. 5, the first connection ends 231 and the second connection ends 232 are shown schematically. Each connection end may have a portion extending in parallel with the XY-plane, and may have a curved portion.

In the semiconductor device 100, current may flow between the first circuit block CB1 and the second circuit block CB2, via the interblock connection portion 202. For example, in the circuit shown in FIG. 3, in a short-circuit state in which the transistors T1 and T2 are turned on at the same time, current may flow between the transistors T1 and T2.

The plurality of second circuit portions 212 in the second circuit block CB2 are arranged side by side along the Y-axis direction. Thus, the length of the current path between each of the second circuit portions 212 and the first circuit block CB1 is different. The size of the current flowing to each of the second circuit portions 212 may vary, since electrical resistance is determined in accordance with the length of the current path. The breakdown voltage of the semiconductor device 100 will be reduced if the current between the plurality of circuit portions provided in parallel varies. For example, the peak value of the short-circuit current flowing to the semiconductor device 100 may become larger.

The interblock connection portion 202 of the present example have a resistance adjusting portion that increases a resistance value in a current path to at least one of the second circuit portions 212 provided thereon. In the example shown in FIG. 5, the resistance adjusting portion may be a slit provided on the plate portion 220. The slit is a groove penetrating the plate portion 220 in the X-axis direction, which diverts the current flowing to at least one of the second circuit portions 212 to increase the current path. In this manner, the resistance value of the current path is increased relative to when there is no slit. Note that, the resistance adjusting portion is not limited to a slit, as long as it increases the resistance value of the current path. As an example, in some parts of the plate portion 220 and each connection end, a resistance adjusting portion made of a material having a higher resistivity than other parts may be provided, a resistance adjusting portion having less thickness in the X-axis direction than other parts may be provided, or a resistance adjusting portion which is a meshed region formed of a plurality of through holes may be provided. For example, a member made of a high-resistivity material may be provided instead of the slit, a region with less thickness may be provided instead of the slit, or a meshed region may be provided with a plurality of through holes, at the location where the slit shown in FIG. 5 is provided.

The interblock connection portion 202 of the present example has at least a resistance adjusting portion that increases a resistance value in the current path 230 from the first circuit block CB1 to the second circuit portion 212-3. The second circuit portion 212-3 is a second circuit portion 212 arranged closest to the first circuit block CB1 in the second circuit block CB2. A longer current path 230 to the second circuit portion 212-3 may efficiently improve the breakdown voltage of the semiconductor device 100, since current is most likely to concentrate at the second circuit portion 212-3 which is closest to the first circuit portion block CB1.

In addition, the resistance adjusting portion may increase a resistance value in a current path from the second circuit block CB2 to the first circuit portion 211-1. The first circuit portion 211-1 is a first circuit portion 211 arranged closest to the second circuit block CB2 in the first circuit block CB1. A longer current path to the first circuit portion 211-1 may efficiently improve the breakdown voltage of the semiconductor device 100, since current is most likely to concentrate at the first circuit portion 211-1.

The resistance adjusting portion of the present example may be a T-shaped slit, as shown in FIG. 5. The resistance adjusting portion of the present example has an edge slit 242, a first inner slit 244-1, and a second inner slit 244-2. The edge slit 242 is provided between the first connection end 231-1 and the second connection end 232-3 on the edge 224 of the plate portion 220, and extends from the edge 224 to the interior of the plate portion 220. The first connection end 231-1 is a first connection end 231 arranged closest to the second connection end 232 among the plurality of first connection ends 231. The second connection end 232-3 is a second connection end 232 arranged closest to the first connection end 231 among the plurality of second connection ends 232. The edge slit 242 may be arranged at the center between the first connection end 231-1 and the second connection end 232-3. The edge slit 242 may extend parallel to the Z-axis direction from the edge 224.

The first inner slit 244-1 is connected to the edge slit 242 in the plate portion 220, and extends along the edge 224 towards the first connection end 231. The first inner slit 244-1 may be provided parallel to the edge 224 or may be inclined against the edge 224. The first inner slit 244-1 may extend outward beyond at least the first connection end 231-1. Outward refers to the direction away from the edge slit 242 on the Y-axis. The first inner slit 244-1 of the present example may extend to the first connection end 231-2, among the plurality of first connection ends 231, arranged at the center in the Y-axis direction, or may extend outward beyond the first connection end 231-2. Such an arrangement enables averaging of the lengths of the current paths corresponding to each of the first connection ends 231. The first inner slit 244-1 may not extend to a location opposing, in the Z-axis direction, the first connection end 231-3 arranged outermost among the plurality of first connection ends 231.

The second inner slit 244-2 is connected to the edge slit 242 in the plate portion 220, and extends along the edge 224 towards the second connection end 232. The second inner slit 244-2 may be provided parallel to the edge 224 or may be inclined against the edge 224. The first inner slit 244-1 and the second inner slit 244-2 are arranged away from the edge 224 in the Z-axis direction. As an example, the first inner slit 244-1 and the second inner slit 244-2 are connected to the upper end in the Z-axis direction of the edge slit 242, and each may extend in the Y-axis direction.

The second inner slit 244-2 may extend outward beyond at least the second connection end 232-3. The second inner slit 244-2 of the present example may extend to the second connection end 232-2, among the plurality of second connection ends 232, arranged at the center in the Y-axis direction, or may extend outward beyond the second connection end 232-2. Such an arrangement enables averaging of the lengths of the current paths corresponding to each of the second connection ends 232. The second inner slit 244-2 may not extend to a location opposing, in the Z-axis direction, the second connection end 232-1 arranged outermost among the plurality of second connection ends 232.

Such a structure allows the length of the current path to the first circuit portion 211-1, the second circuit portion 212-3 and the like arranged inside to increase. Thus, the electrical resistance value of these current paths can be increased.

The interblock connection portion 202 of the present example has an external connection end 222 provided thereon. The external connection end 222 may protrude upward from the edge 226. The external connection end 222 of the present example functions as the fifth external connection terminal tm5 (U).

The plate portion 220 of the present example may have a narrow region 228 having a smaller width W1 in the Z-axis direction than other regions. For example, the narrow region 228 is arranged in a region without a convex portion 116 in FIG. 1, and other parts of the plate portion 220 besides the narrow region 228 are arranged under the convex portion 116. That is, a narrow region 228 may be provided in the plate portion 220, depending on the shape or the like of the casing portion 110. The width W2 of the plate portion 220 between the inner slit 244 and the edge 224 may be the same as the width W1 of the narrow region 228, or may be smaller than the width W1. By setting the width W2 as described above, the variation in the resistance values of the current path of the second circuit portion 212-1 in which the narrow region 228 is included, and the current path of the other second circuit portions 212 can be reduced.

In addition, in the semiconductor device 100, the current may flow in a U-shape or a C-shape between the plurality of circuit blocks CB. For example, when the first external connection terminal tm1 (P) and the fourth external connection terminal tm4 (N) are short-circuited, the current flows in a U-shape through the fourth circuit block CB4, the first circuit block CB1, the second circuit block CB2, and the third circuit block CB3, in this order. In addition, when the second external connection terminal tm2 (M1) and the fourth external connection terminal tm4 (N) are short-circuited, the current flows in a C-shape through the first circuit block CB1, the second circuit block CB2, and the third circuit block CB3, in this order. In addition, when the third external connection terminal tm3 (M2) and the first external connection terminal tm1 (P) are short-circuited, the current flows in a C-shape through the second circuit block CB2, the first circuit block CB1, and the fourth circuit block CB4, in this order.

When the current flows around the internal circuit in a U-shape or a C-shape, the current path to the circuit portion arranged closer to the circulating center of the current is likely to become shorter than the current path to the circuit portion arranged away from the circulating center. Since the current path of the circuit portion arranged closest to the circulating center can be increased with the interblock connection portion 202 of the present example, the overall balance of the lengths of the current paths may be improved.

Note that, although the interblock connection portion 202 in FIG. 5 had a first inner slit 244-1 and a second inner slit 244-2, it may have either one of the first inner slit 244-1 or the second inner slit 244-2 in other examples. Even in such cases, the inner slit 244 is connected to the edge slit 242.

Figure 6:
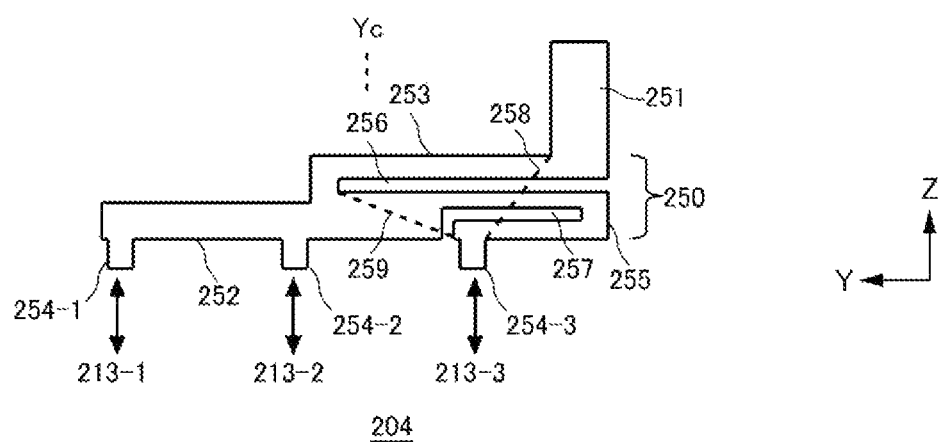
FIG. 6 shows an exemplary shape of a first intrablock connection portion 204.

FIG. 6 shows an exemplary shape of a first intrablock connection portion 204. The first intrablock connection portion 204 has a plate portion 250, a plurality of third connection ends 254, and an external connection end 251. The plate portion 250 may be a plate member extending from above the third circuit portion 213-1 arranged at one end to above the third circuit portion 213-3 arranged at the other end, among the plurality of third circuit portions 213 arranged side by side in the Y-axis direction. The plate portion 250 may be provided perpendicular to the XY-plane. The plate portion 250 has an edge 252 opposing the third circuit block CB3, and an edge 253 on a side opposite to the edge 252.

The third connection ends 254 are provided for each of the third circuit portions 213. The third connection ends 254 protrude from the edge 252 of the plate portion 250 towards the third circuit portion 213, and are connected to the third circuit portions 213. In FIG. 6, the third connection ends 254 are shown schematically. The third connection ends 254 may have a portion extending in parallel with the XY-plane, and may have a curved portion.

The external connection end 251 may protrude upward from the edge 253. The external connection end 251 of the present example functions as the fourth external connection terminal tm4 (N).

The plate portion 250 of the present example has a slit 256 provided thereon. The slit 256 may be provided such that it traverses the shortest straight line 258 that links the third connection end 254-3, among the third connection ends 254, arranged closest to the fourth circuit block CB4 with the external connection end 251. In this manner, the slit 256 elongates the current path between the external connection end 251 and the third connection end 254-3, and allows the resistance value of the current path to the third connection end 254-3 to increase. Thus, the current flowing to the third circuit portion 213-3 arranged closer to the circulating center of the current can be reduced. The slit 256 of the present example is provided such that it traverses the shortest straight line that links the third connection end 254-2 with the external connection end 251.

As an example, the slit 256 is a straight-line slit. The end of the slit 256 extends from either edge of the plate portion 250 to the interior of the plate portion 250. The slit 256 of the present example is provided on the edge 255, among the edges parallel to the Z-axis of the plate portion 250, that is closest to the third connection end 254-3.

The plate portion 250 of the present example has a slit 257 provided thereon. The slit 257 is provided such that it traverses the shortest straight line 259 that links the end in the Y-axis direction of the slit 256 in the interior of the plate portion 250, with the third connection end 254-3. On the other hand, the slit 257 is not arranged between the end in the Y-axis direction of the slit 256, and the third connection end 254-2. In this manner, the resistance value of the current path to the third connection end 254 arranged further inside can be increased even more.

As an example, the slit 257 is a slit having an L-shape. The slit 257 extends from the edge 252 between the third connection end 254-2 and the third connection end 254-3 to the interior of the plate portion 250. The slit 257 of the present example extends in the Z-axis direction from the edge 252, and further, extends in the Y-axis direction towards the third connection end 254-3. The portion of the slit 257 that extend in the Y-axis direction extends beyond the third connection end 254-3 to the edge 255 side that has the slit 256 provided thereon.

In the present example, the external connection end 251 is arranged to be closer to the fourth circuit block CB4 than the center Yc of the plate portion 250 in the first direction (Y-axis direction). The external connection end 251 may be provided at the end on the edge 255 side, on the edge 253 of the plate portion 250.

Figure 7:
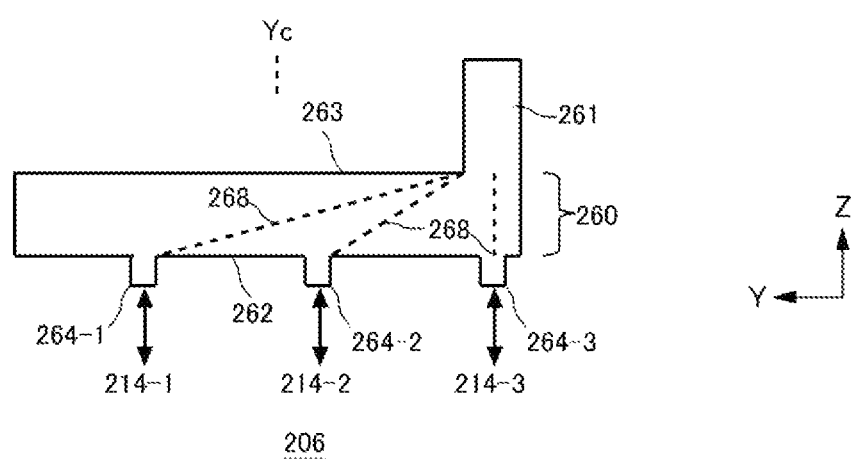
FIG. 7 shows an exemplary shape of a second intrablock connection portion 206.

FIG. 7 shows an exemplary shape of a second intrablock connection portion 206. The second intrablock connection portion 206 has a plate portion 260, a plurality of fourth connection ends 264, and an external connection end 261. The plate portion 260 may be a plate member extending from above the fourth circuit portion 214-1 arranged at one end to above the fourth circuit portion 214-3 arranged at the other end, among the plurality of fourth circuit portions 214 arranged side by side in the Y-axis direction. The plate portion 260 may be provided perpendicular to the XY-plane. The plate portion 260 has an edge 262 opposing the fourth circuit block CB4, and an edge 263 on a side opposite to the edge 262.

The fourth connection ends 264 are provided for each of the fourth circuit portions 214. The fourth connection ends 264 protrude from the edge 262 of the plate portion 260 towards the fourth circuit portion 214, and are connected to the fourth circuit portions 214. In FIG. 7, the fourth connection ends 264 are shown schematically. The fourth connection ends 264 may have a portion extending in parallel with the XY-plane, and may have a curved portion.

The external connection end 261 may protrude upward from the edge 263. The external connection end 261 of the present example functions as the first external connection terminal tm1 (P).

In the present example, the external connection end 261 is arranged to be farther from the third circuit block CB3 than the center Yc of the first direction (Y-axis direction) in the plate portion 260. The external connection end 261 may be provided at the end on the side opposite to the third circuit block CB3, on the edge 263 of the plate portion 260.

In the the present example, the plate portion 260 of the second intrablock connection portion 206 does not have a slit provided thereon, that traverses straight lines 268 each linking the respective fourth connection ends 264 with the external connection end 261. In the present example, since the external connection end 261 is arranged on the outer side, the resistance value of the current path from the external connection end 261 to the fourth connection end 264-1 arranged on the inner side is larger than the resistance value of the current path to the fourth connection end 264-3 arranged on the outer side. In this manner, the resistance value of the current path to the circuit portion arranged near the circulating center of the current can be increased, and variation in the resistance values of the current paths can be reduced for the entire circuit. Note that, the second intrablock connection portion 206 may also have a slit provided thereon, in a manner similar to the first intrablock connection portion 204.

The location of the external connection terminal of the intrablock connection portion shown in FIG. 6 and FIG. 7 is limited by the shape of the casing portion 110, arrangement of the external device, and the like. On the contrary, by determining whether or not to have a slit provided in the intrablock connection portion, depending on the location of the external connection terminal, as shown in FIG. 6 and FIG. 7, the variation in resistance values of the current path in the entire circuit can be reduced.

Figure 8:
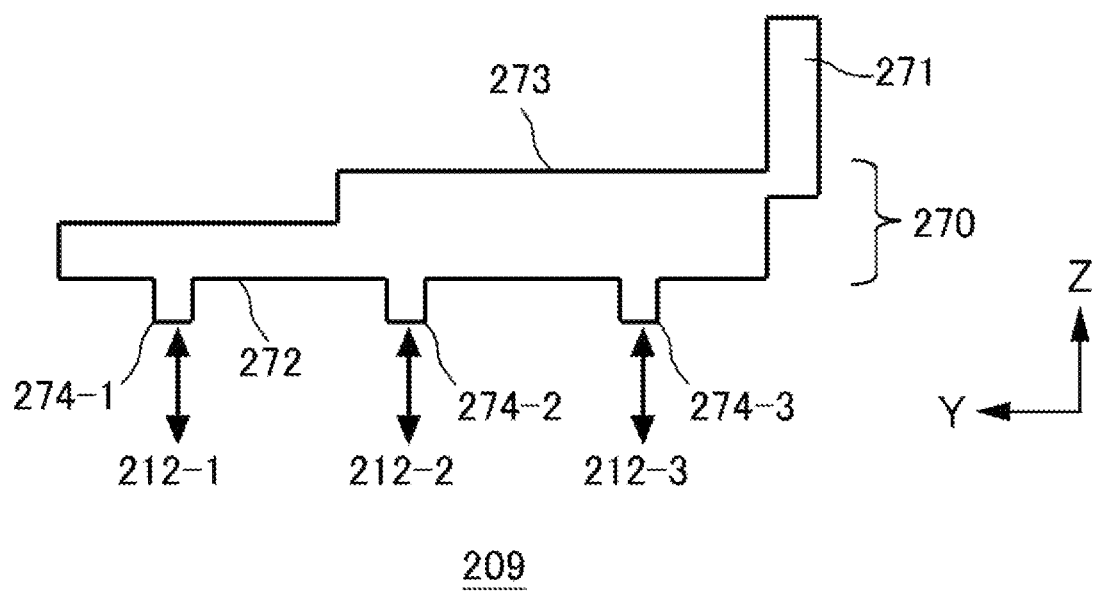
FIG. 8 shows an exemplary shape of a fourth intrablock connection portion 209.

FIG. 8 shows an exemplary shape of a fourth intrablock connection portion 209. The fourth intrablock connection portion 209 has a plate portion 270, a plurality of fifth connection ends 274, and an external connection end 271. The plate portion 270 may be a plate member extending from above the second circuit portion 212-1 arranged at one end to above the second circuit portion 212-3 arranged at the other end, among the plurality of second circuit portions 212 arranged side by side in the Y-axis direction. The plate portion 270 may be provided perpendicular to the XY-plane. The plate portion 270 has an edge 272 opposing the second circuit block CB2, and an edge 273 on a side opposite to the edge 272.

The fifth connection ends 274 are provided for each of the second circuit portions 212. The fifth connection ends 274 protrude from the edge 272 of the plate portion 270 towards the second circuit portion 212, and are connected to the second circuit portions 212. In FIG. 8, the fifth connection ends 274 are shown schematically. The fifth connection ends 274 may have a portion extending in parallel with the XY-plane, and may have a curved portion.

The external connection end 271 may protrude upward from the edge 273. The external connection end 271 of the present example functions as the third external connection terminal tm3 (M2).

The plate portion 270 of the fourth intrablock connection portion 209 may or may not have a slit provided thereon. If a slit is provided, the plate portion 270 may have a slit similar to that of the plate portion 250 shown in FIG. 6 provided thereon.

Figure 9:
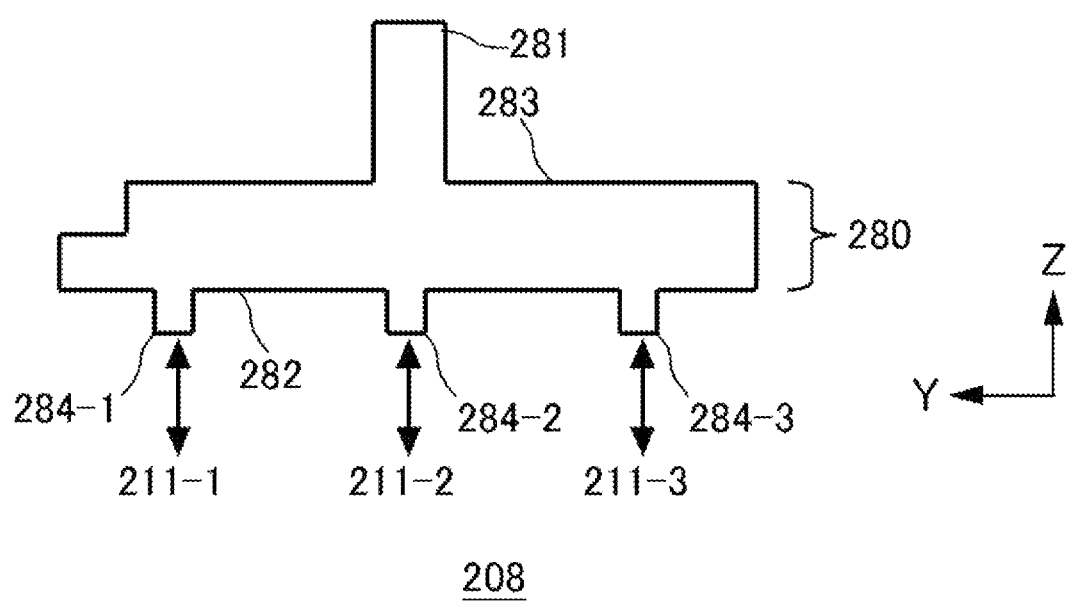
FIG. 9 shows an exemplary shape of a third intrablock connection portion 208.

FIG. 9 shows an exemplary shape of a third intrablock connection portion 208. The third intrablock connection portion 208 has a plate portion 280, a plurality of sixth connection ends 284, and an external connection end 281. The plate portion 280 may be a plate member extending from above the first circuit portion 211-1 arranged at one end to above the first circuit portion 211-3 arranged at the other end, among the plurality of first circuit portions 211 arranged side by side in the Y-axis direction. The plate portion 280 may be provided perpendicular to the XY-plane. The plate portion 280 has an edge 282 opposing the first circuit block CB1, and an edge 283 on a side opposite to the edge 282.

The sixth connection ends 284 are provided for each of the first circuit portions 211. The sixth connection ends 284 protrude from the edge 282 of the plate portion 280 towards the first circuit portion 211, and are connected to the first circuit portions 211. In FIG. 9, the sixth connection ends 284 are shown schematically. The sixth connection ends 284 may have a portion extending in parallel with the XY-plane, and may have a curved portion.

The external connection end 281 may protrude upward from the edge 283. The external connection end 281 of the present example functions as the second external connection terminal tm2 (M1).

The plate portion 280 of the third intrablock connection portion 208 may or may not have a slit provided thereon. If a slit is provided, the plate portion 280 may have a slit similar to that of the plate portion 250 shown in FIG. 6 provided thereon. In the example shown in FIG. 9, the current path between the external connection end 281 and the sixth connection end 284-2 is the shortest. The slit may be provided such that it traverses a straight line that links the external connection end 281 with the sixth connection end 284-2.

Figure 10:
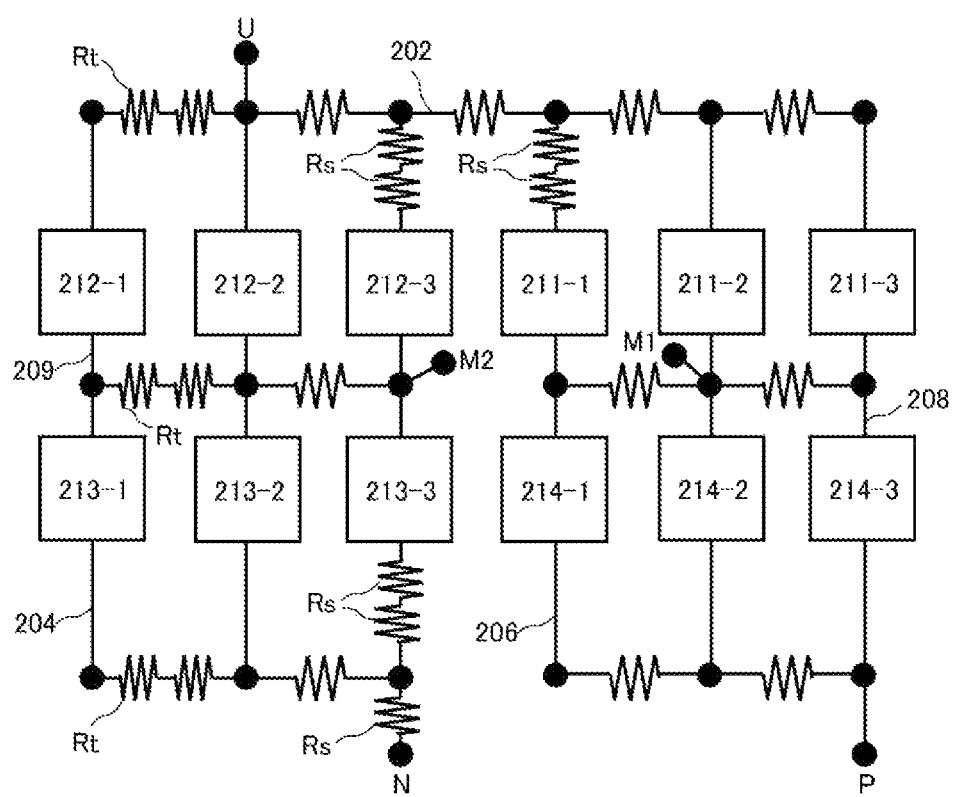
FIG. 10 schematically shows the resistance of the interblock connection portion 202 and the intrablock connection portions between each of the circuit portions.

FIG. 10 schematically shows the resistance of the interblock connection portion 202 and the intrablock connection portions between each of the circuit portions. In FIG. 10, the resistance increased by providing a slit in the interblock connection portion 202 and the first intrablock connection portion 204 is shown as Rs. In addition, the resistance increased by providing a narrow region is shown as Rt.

As shown in FIG. 10, resistance Rs can be added to the first circuit portion 211-1 and the second circuit portion 212-3 by providing a slit on the interblock connection portion 202. In this manner, the resistance values of the current paths between the plurality of first circuit portions 211 and the plurality of second circuit portions 212 can be equalized. In addition, resistance Rs can be added to the third circuit portion 213-3 by providing a slit on the first intrablock connection portion 204. In this manner, the resistance values of the current paths between the fourth external connection terminal tm4 (N) and the respective third circuit portions 213 can be equalized. In addition, by adding resistance Rs, the current can be equalized between the circuit portions on the inner side and the circuit portions on the outer side, when the current flows in a U-shape or a C-shape.

Second Example

Figure 11:
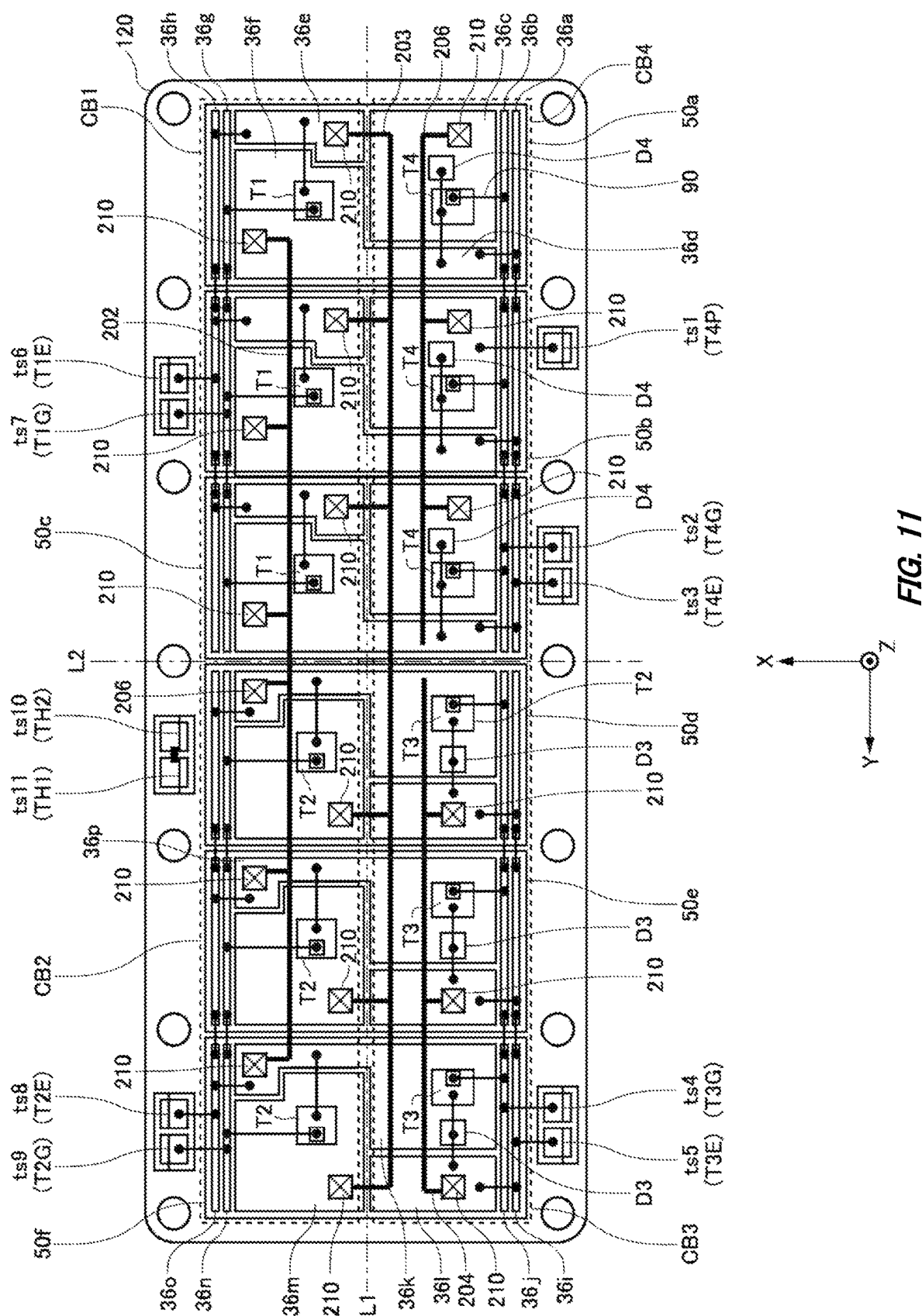
FIG. 11 shows an exemplary arrangement of the internal circuit according to the second example.

FIG. 11 shows an exemplary arrangement of the internal circuit according to the second example. The internal circuit of the present example does not include the diodes D1 and D2. In addition, the arrangement of the interblock connection portion and the intrablock connection portions differs from that of the first example shown in FIG. 2 to FIG. 10. Other structure is similar to that of the first example.

The semiconductor device 100 of the present example has an interblock connection portion 202 and an interblock connection portion 203. The interblock connection portion 202 connects the first circuit block CB1 and the second circuit block CB2. Note that, the interblock connection portion 202 of the present example is connected to a plurality of conductivity patterns 36f and a plurality of conductivity patterns 36p. The interblock connection portion 202 functions as the fifth external connection terminal tm5 (U), in a manner similar to the interblock connection portion 202 as shown in the first example.

The interblock connection portion 203 connects the first circuit block CB1 and the second circuit block CB2. The interblock connection portion 203 is connected to a plurality of conductivity patterns 36e and a plurality of conductivity patterns 36m. The interblock connection portion 203 functions as the second external connection terminal tm2 (M1) and the third external connection terminal tm3 (M2), in a manner similar to the third intrablock connection portion 208 and the fourth intrablock connection portion 209 as shown in FIG. 2.

The semiconductor device 100 of the present example includes a first intrablock connection portion 204 and a second intrablock connection portion 206. The connection to the circuit blocks CB of the first intrablock connection portion 204 and the second intrablock connection portion 206 is similar to that of the first intrablock connection portion 204 and the second intrablock connection portion 206 as shown in the first example. The shapes of the first intrablock connection portion 204 and the second intrablock connection portion 206 may be identical to those of the first intrablock connection portion 204 and the second intrablock connection portion 206 as shown in the first example.

Figure 12:
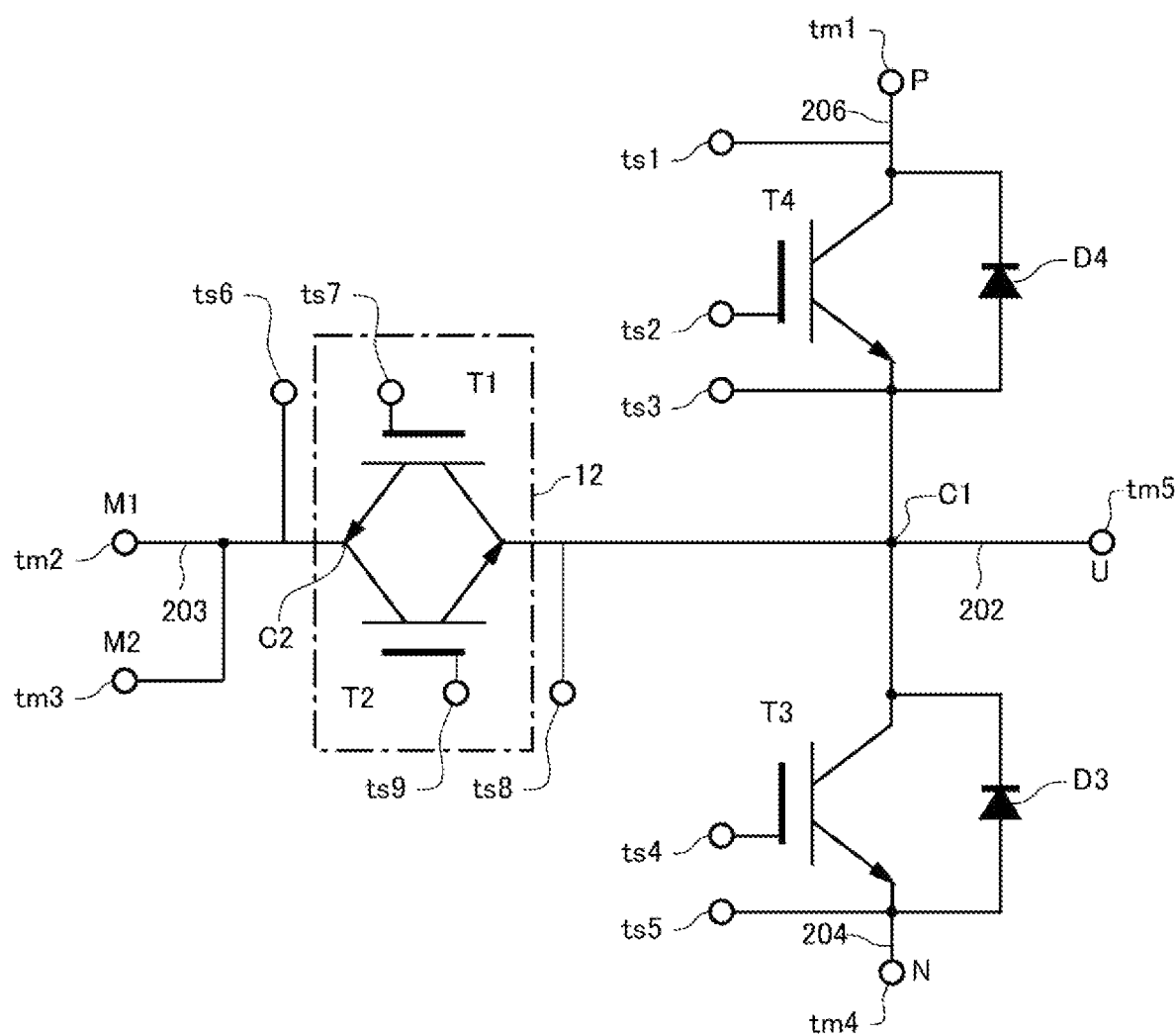
FIG. 12 shows an example of a circuit configuration of the internal circuit of the semiconductor device 100 shown in FIG. 11.

FIG. 12 shows an example of a circuit configuration of the internal circuit of the semiconductor device 100 shown in FIG. 11. The internal circuit of the present example is a circuit with one phase (U-phase) of the three phases (the U-phase, the V-phase, and the W-phase) of a three-level power conversion (inverter) circuit. The internal circuit of the the present example is a T-type three-level power conversion circuit with four transistors T connected in a T-shape.

The transistor T4 and the transistor T3 are connected in series in this order between the first external connection terminal tm1 (P) and the fourth external connection terminal tm4 (N). The connection point between an emitter terminal of the transistor T4 and a collector terminal of the transistor T3 is assumed as the connection point C1. The connection point C1 is connected to the fifth external connection terminal tm5 (U) as an AC output terminal.

A bidirectional switching element 12 is provided between the connection point C1 and the second and third external connection terminals tm2 (M1) and tm3 (M2). The bidirectional switching element 12 has the transistors T1 and T2. The transistors T1 and T2 forming the bidirectional switching element 12 may be reverse blocking IGBTs (RB-IGBTs). The emitter terminal of the transistor T1 is connected to the collector terminal of the transistor T2, and the collector terminal of the transistor T1 is connected to the emitter terminal of the transistor T2. The connection point C2 between the emitter terminal of the transistor T1 and the collector terminal of the transistor T2 is connected to the second external connection terminal tm2 (M1) and the third external connection terminal tm3 (M2).

Figure 13:
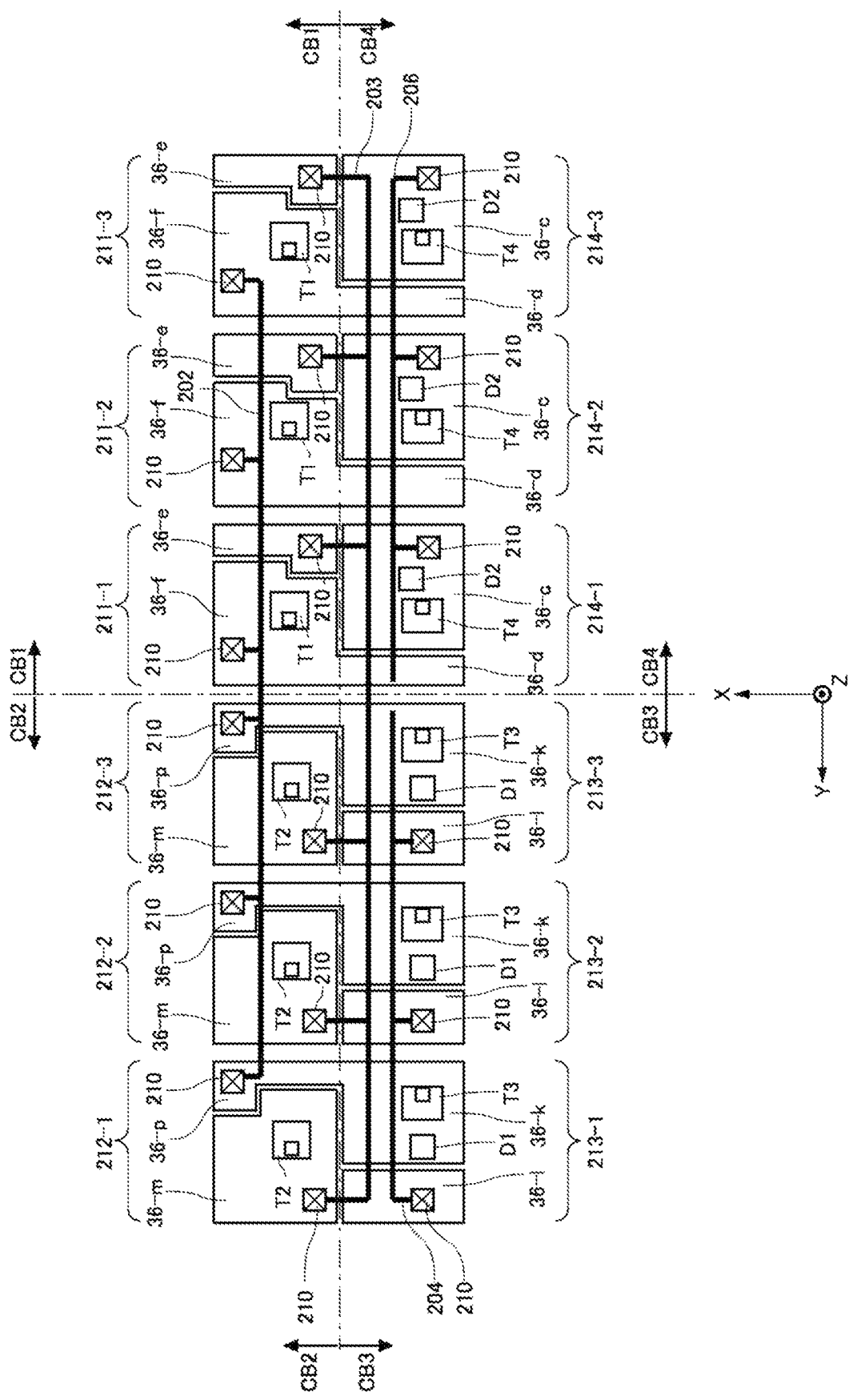
FIG. 13 describes a summary of each of the circuit blocks CB in the semiconductor device 100 shown in FIG. 11.

FIG. 13 describes a summary of each of the circuit blocks CB in the semiconductor device 100 shown in FIG. 11. The arrangement of each of the circuit blocks CB is identical to the example shown in FIG. 4A.

The interblock connection portion 202 in FIG. 13 has a structure similar to that of the interblock connection portion 202 shown in FIG. 5. Thus, when the current flows between the first circuit block CB1 and the second circuit block CB2, the variation in resistance values of the current path to each of the circuit portions can be thereby reduced.

In the semiconductor device 100 of the present example, the current may also flow in a U-shape between the plurality of circuit blocks CB. For example, in the circuit shown in FIG. 12, when the transistors T3 and T4 are turned on at the same time and the first external connection terminal tm1 (P) and the fourth external connection terminal tm4 (N) are in a short-circuit state, the current flows through the transistor T4, the conductivity pattern 36d, the conductivity pattern 36f, the interblock connection portion 202, the conductivity pattern 36p, the conductivity pattern 36k, and the transistor T3, in this order. As described above, when the first external connection terminal tm1 (P) and the fourth external connection terminal tm4 (N) are in a short-circuit state, the current flows in a U-shape through the fourth circuit block CB4, the first circuit block CB1, the second circuit block CB2, and the third circuit block CB3, in this order.

As described above, when the current flows around a predetermined circulating center, such as in a U-shape, the current path to a circuit portion arranged closer to the circulating center is likely to become shorter than the current path to a circuit portion arranged away from the circulating center. Since the current path to the circuit portion arranged closest to the circulating center can be increased with the interblock connection portion 202 of the present example, the overall balance of the lengths of the current paths may be improved.

Figure 14:
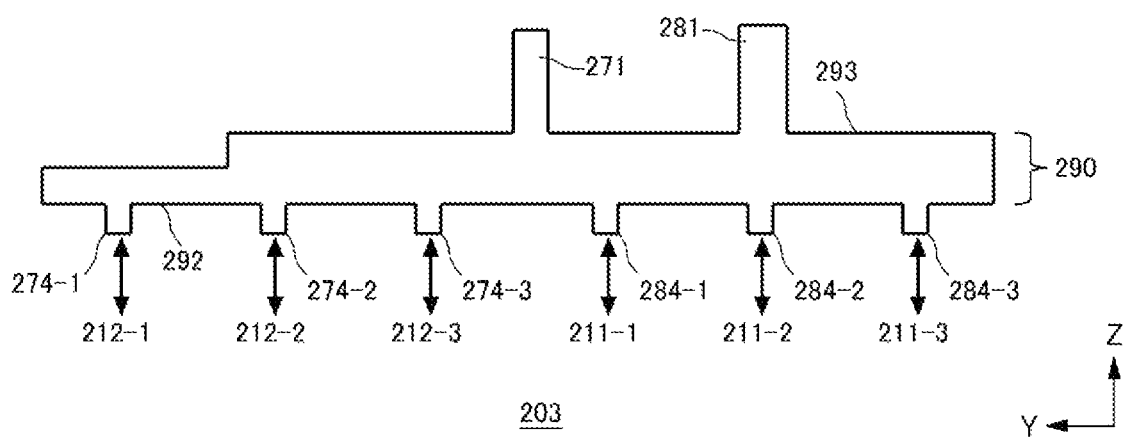
FIG. 14 shows an exemplary shape of the interblock connection portion 203.

FIG. 14 shows an exemplary shape of the interblock connection portion 203. The interblock connection portion 203 of the present example has a plate portion 290, a plurality of fifth connection ends 274, a plurality of sixth connection ends 284, an external connection end 271, and an external connection end 281. The plate portion 290 may be a plate member that extends from above the first circuit portion 211-3 arranged at one end to above the second circuit portion 212-1 arranged at the other end, among the plurality of first circuit portions 211 and the plurality of second circuit portions 212 arranged side by side in the Y-axis direction. The plate portion 290 may be provided perpendicular to the XY-plane. The plate portion 290 has an edge 292 opposing the first and second circuit blocks CB1 and CB2, and an edge 293 on a side opposite to the edge 292.

The fifth connection end 274 is provided for each of the second circuit portions 212. The fifth connection ends 274 protrude from the edge 292 of the plate portion 290 towards the second circuit portion 212, and are connected to the second circuit portions 212. The sixth connection ends 284 are provided for each of the first circuit portions 211. The sixth connection ends 284 protrude from the edge 292 of the plate portion 290 towards the first circuit portions 211, and are connected to the first circuit portions 211. In FIG. 14, the fifth connection end 274 and the sixth connection ends 284 are shown schematically. The fifth connection end 274 and the sixth connection end 284 may have a portion extending in parallel with the XY-plane, and may have a curved portion.

The external connection end 271 and the external connection end 281 may protrude upward from the edge 293. The external connection end 271 of the present example functions as the third external connection terminal tm3 (M2). The external connection end 281 functions as the second external connection terminal tm2 (M1).

The plate portion 290 may or may not have a slit provided thereon. If a slit is provided, the plate portion 290 may have a slit similar to that of the plate portion 250 shown in FIG. 6 provided thereon. The plate portion 290 may have an edge slit 242 provided between the fifth connection end 274-3 and the sixth connection end 284-1, a first inner slit 244-1 connected to the edge slit 242, and a second inner slit 244-2.

Figure 15:
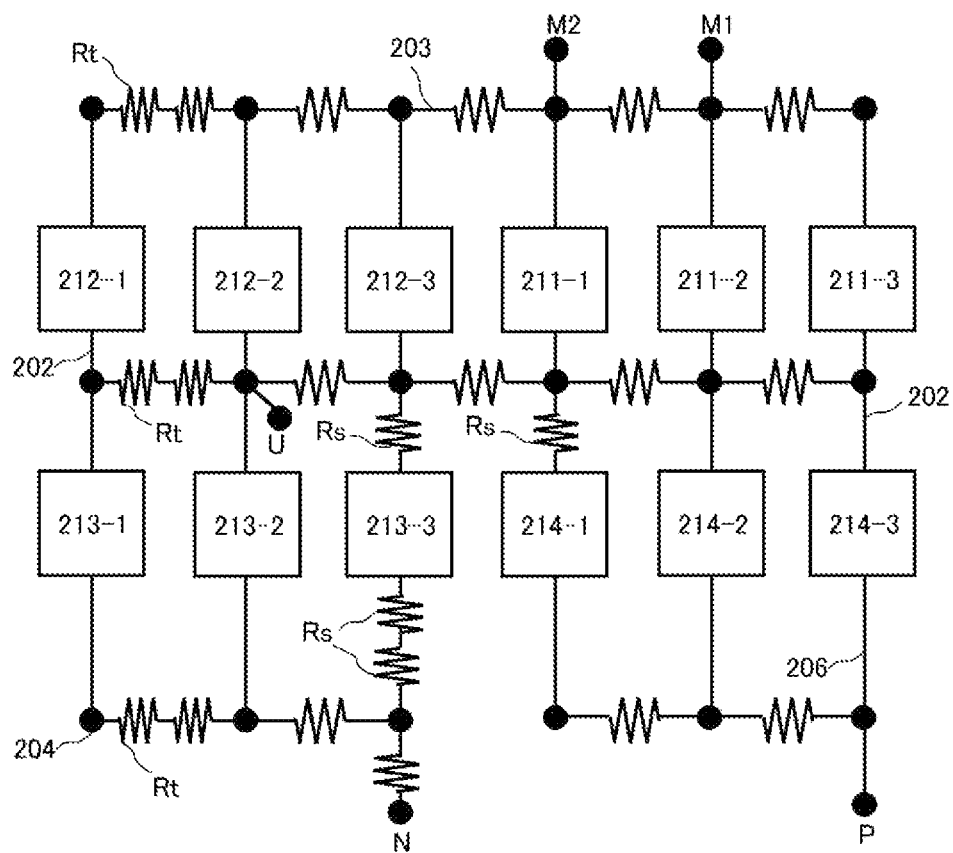
FIG. 15 schematically shows the resistance of the interblock connection portions and the intrablock connection portions in the second example.

FIG. 15 schematically shows the resistance of the interblock connection portions and the intrablock connection portions in the second example. In FIG. 15, the resistance increased by providing a slit in the interblock connection portion 202 and the first intrablock connection portion 204 is shown as Rs. In addition, the resistance increased by providing a narrow region is shown as Rt.

As shown in FIG. 15, the resistance Rs can be added to the third circuit portion 213-3 and the fourth circuit portion 214-1 by providing a slit on the interblock connection portion 202. In this manner, the resistance values of the current paths between the plurality of third circuit portions 213 and the plurality of fourth circuit portions 214 can be equalized. In addition, resistance Rs can be added to the third circuit portion 213-3 by providing a slit on the first intrablock connection portion 204. In this manner, the resistance values of the current paths between the fourth external connection terminal tm4 (N) and the respective third circuit portions 213 can be equalized. In addition, by adding resistance Rs, the current can be equalized between the circuit portions on the inner side and the circuit portions on the outer side, when the current flows in a U-shape.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES 12 bidirectional switching element, 36 conductivity pattern, 50 insulating substrate, 90 connection member, 100 semiconductor device, 110 casing portion, 112 notch portion, 114 terminal arrangement surface, 116 convex portion, 120 base portion, 201 straight line, 202 interblock connection portion, 203 interblock connection portion, 204 first intrablock connection portion, 206 second intrablock connection portion, 208 third intrablock connection portion, 209 fourth intrablock connection portion, 210 connection region, 211 first circuit portion, 212 second circuit portion, 213 third circuit portion, 214 fourth circuit portion, 220 plate portion, 222 external connection end, 224 edge, 226 edge, 228 narrow region, 230 current path, 231 first connection end, 232 second connection end, 242 edge slit, 244 inner slit, 250 plate portion, 251, external connection end, 252 edge, 253 edge, 254 third connection end, 255 edge, 256 slit, 257 slit, 258 straight line, 259 straight line, 260 plate portion, 261 external connection end, 262 edge, 263 edge, 264 fourth connection end, 268 straight line, 270 plate portion, 271 external connection end, 272 edge, 273 edge, 274 fifth connection end, 280 plate portion, 281 external connection end, 282 edge, 283 edge, 284 sixth connection end, 290 plate portion, 292 edge, 293 edge.

What is claimed is:
1. A semiconductor device comprising:
a plurality of circuit blocks, each of the plurality of circuit blocks having a plurality of circuit portions connected in parallel;
an interblock connection portion electrically connecting two circuit blocks among the plurality of circuit blocks; and an intrablock connection portion provided in one circuit block among the plurality of circuit blocks and connecting the plurality of circuit portions within the one circuit block,
wherein a first circuit block having a plurality of first circuit portions and a second circuit block having a plurality of second circuit portions are included in the plurality of circuit blocks,
wherein the interblock connection portion electrically connects the first circuit block and the second circuit block and has a resistance adjusting portion that increases a resistance value in a current path from the first circuit block to a second circuit portion, among the plurality of second circuit portions, arranged closest to the first circuit block, and
wherein the intrablock connection portion includes:
a plate portion;
a plurality of connection ends protruding from the plate portion and connected to the plurality of circuit portions;
an external connection end protruding from the plate portion and provided on an opposite side of the plate portion with respect to the plurality of connection ends; and
a first slit provided such that the first slit traverses a straight line that links at least one connection end among the plurality of connection ends and the external connection end.

2. The semiconductor device according to claim 1, wherein
the plurality of first circuit portions are arranged side by side in a first direction,
the plurality of second circuit portions are arranged side by side in the first direction, and
the first circuit block and the second circuit block are arranged side by side in the first direction.

3. The semiconductor device according to claim 2, wherein
the resistance adjusting portion increases a resistance value in a current path from the second circuit block to a first circuit portion, among the plurality of first circuit portions, arranged closest to the second circuit block.

4. The semiconductor device according to claim 3, wherein
the interblock connection portion has:
a plate portion;
a plurality of first connection ends, each of which provided corresponding to each one of the plurality of first circuit portions, the plurality of first connection ends protruding from an edge of the plate portion of the interblock connection portion to be connected to the corresponding one of the plurality of first circuit portions; and
a plurality of second connection ends, each of which provided corresponding to each one of the plurality of second circuit portions, the plurality of second connection ends protruding from the edge of the plate portion of the interblock connection portion to be connected to the corresponding one of the plurality of second circuit portions, and
the resistance adjusting portion has:
an edge slit provided between a first connection end, among the plurality of first connection ends, arranged closest to the plurality of second connection ends and a second connection end, among the plurality of second connection ends, arranged closest to the plurality of first connection ends on the edge of the plate portion of the interblock connection portion, the edge slit extending from the edge to an interior of the plate portion of the interblock connection portion;
a first inner slit connected to the edge slit in the plate portion of the interblock connection portion, the first inner slit extending towards the plurality of first connection ends along the edge;
a second inner slit connected to the edge slit in the plate portion of the interblock connection portion, the second inner slit extending towards the plurality of second connection ends along the edge; and
a narrow region opposing a second connection end, among the plurality of second connection ends, that is farthest from the plurality of first connection ends in the plate portion of the interblock connection portion, a width of the narrow region in an extending direction of the edge slit being smaller than a width, in the extending direction, of the plate portion of the interblock connection portion opposing a first connection end, among the plurality of first connection ends, that is farthest from the plurality of second connection ends,
wherein the width of the narrow region is equal to or larger than a width of the plate portion of the interblock connection portion between the first inner slit and the edge.

5. The semiconductor device according to claim 2, wherein
the interblock connection portion has a plate portion, and
the resistance adjusting portion is a slit provided on the plate portion of the interblock connection portion.

6. The semiconductor device according to claim 5, wherein,
the interblock connection portion has:
a plurality of first connection ends, each of which provided corresponding to each one of the plurality of first circuit portions, the plurality of first connection ends protruding from an edge of the plate portion of the interblock connection portion to be connected to the corresponding one of the plurality of first circuit portions; and
a plurality of second connection ends, each of which provided corresponding to each one of the plurality of second circuit portions, the plurality of second connection ends protruding from the edge of the plate portion of the interblock connection portion to be connected to the corresponding one of the plurality of second circuit portions, and
the resistance adjusting portion has:
an edge slit provided between a first connection end, among the plurality of first connection ends, arranged closest to the plurality of second connection ends and a second connection end, among the plurality of second connection ends, arranged closest to the plurality of first connection ends on the edge of the plate portion of the interblock connection portion, the edge slit extending from the edge to an interior of the plate portion of the interblock connection portion;
a first inner slit connected to the edge slit in the plate portion of the interblock connection portion, the first inner slit extending towards the plurality of first connection ends along the edge; and
a second inner slit connected to the edge slit in the plate portion of the interblock connection portion, the second inner slit extending towards the plurality of second connection ends along the edge.

7. The semiconductor device according to claim 6, wherein
the first inner slit extends outward beyond at least one of the plurality of first connection ends, and
the second inner slit extends outward beyond at least one of the plurality of second connection ends.

8. The semiconductor device according to claim 7, wherein
the first inner slit extends to at least two of the plurality of first connection ends, and
the second inner slit extends to at least two of the plurality of second connection ends.

9. The semiconductor device according to claim 2, wherein the plurality of circuit blocks includes:
a third circuit block arranged side by side with the second circuit block in a second direction perpendicular to the first direction, the third circuit block being electrically connected to the second circuit block; and
a fourth circuit block arranged side by side with the first circuit block in the second direction and side by side with the third circuit block in the first direction, the fourth circuit block being electrically connected to the first circuit block,
wherein the third circuit block has a plurality of third circuit portions electrically connected in parallel and arranged side by side in the first direction, and
the fourth circuit block has a plurality of fourth circuit portions electrically connected in parallel and arranged side by side in the first direction.

10. The semiconductor device according to claim 9, comprising a first intrablock connection portion electrically connected to the third circuit block, wherein
the first intrablock connection portion has:
a plate portion on which a slit is provided;
a first external connection end protruding from the plate portion of the first intrablock connection portion; and
a plurality of third connection ends, each of which provided corresponding to each one of the plurality of third circuit portions, the plurality of third connection ends protruding from an edge of the plate portion of the first intrablock connection portion to be connected to the corresponding one of the plurality of third circuit portions,
wherein a first slit is provided such that the first slit traverses a straight line that links a third connection end, among the plurality of third connection ends, arranged closest to the fourth circuit block with the first external connection end of the first intrablock connection portion.

11. The semiconductor device according to claim 10, wherein
at least two slits are provided on the plate portion of the first intrablock connection portion, and
a second slit is provided such that the second slit traverses a straight line that links the third connection end, among the plurality of third connection ends, arranged closest to the fourth circuit block with an end of the first slit on a side opposite to the fourth circuit block.

12. The semiconductor device according to claim 11, wherein
the second slit has a L-shape.

13. The semiconductor device according to claim 10, comprising a second intrablock connection portion electrically connected to the fourth circuit block, wherein
the second intrablock connection portion has:
a plate portion;
a second external connection end protruding from the plate portion of the second intrablock connection portion; and
a plurality of fourth connection ends, each of which provided corresponding to each one of the plurality of fourth circuit portions, the plurality of fourth connection ends protruding from an edge of the plate portion of the second intrablock connection portion to be connected to the corresponding one of the plurality of fourth circuit portions,
wherein the first external connection end is arranged to be closer to the fourth circuit block than the center of the plate portion of the first intrablock connection portion in the first direction,
the second external connection end is arranged to be farther away from the third circuit block than the center of the plate portion of the second intrablock connection portion in the first direction, and
a slit traversing straight lines that each links the respective fourth connection ends with the second external connection end is not provided in the plate portion of the second intrablock connection portion.

14. The semiconductor device according to claim 1, wherein
the plurality of circuit portions are arranged side by side in a first direction, and
the first slit extends in the first direction.

15. A semiconductor device comprising:
a first circuit block having a plurality of first circuit portions connected in parallel and arranged side by side in a first direction;
a second circuit block having a plurality of second circuit portions connected in parallel and arranged side by side in the first direction, which is arranged side by side in the first direction with the first circuit block;
a third circuit block having a plurality of third circuit portions connected in parallel and arranged side by side in the first direction, which is arranged side by side with the second circuit block in a second direction perpendicular to the first direction;
a fourth circuit block having a plurality of fourth circuit portions connected in parallel and arranged side by side in the first direction, which is arranged side by side with the third circuit block in the first direction and side by side with the first circuit block in the second direction;
a first intrablock connection portion electrically connected to the third circuit block; and
a second intrablock connection portion electrically connected to the fourth circuit block,
wherein the first intrablock connection portion has:
a first external connection end arranged to be closer to the fourth circuit block than the center of the first intrablock connection portion; and
a first resistance adjusting portion that increases a resistance value in a current path from a third circuit portion arranged closest to the fourth circuit block to the first external connection end, and
the second intrablock connection portion has:
a second external connection end arranged to be farther away from the third circuit block than the center of the second intrablock connection portion.

16. The semiconductor device according to claim 15, further comprising a first interblock connection portion electrically connecting the first circuit block and the second circuit block, wherein the first interblock connection portion has a second resistance adjusting portion that increases a resistance value in a current path from the first circuit block to a second circuit portion arranged closest to the first circuit block in the second circuit block, and the second resistance adjusting portion increases a resistance value in a current path from the second circuit block to a first circuit portion arranged closest to the second circuit block in the first circuit block.

17. The semiconductor device according to claim 16, wherein
the first interblock connection portion further has a third external connection end, and
the first external connection end, the second external connection end, and the third external connection end are arranged side by side in the first direction.

18. The semiconductor device according to claim 15, further comprising a second interblock connection portion electrically connecting the third circuit block and the fourth circuit block, wherein
the second interblock connection portion has a third resistance adjusting portion that increases a resistance value in a current path from the fourth circuit block to a third circuit portion arranged closest to the fourth circuit block in the third circuit block, and
the third resistance adjusting portion increases a resistance value in a current path from the third circuit block to a fourth circuit portion arranged closest to the third circuit block in the fourth circuit block.

19. A semiconductor device comprising:
a plurality of circuit blocks, each of the plurality of circuit blocks having a plurality of circuit portions connected in parallel;
an interblock connection portion electrically connecting two circuit blocks among the plurality of circuit blocks; and
a plurality of intrablock connection portions, each of which provided in corresponding one circuit block among the plurality of circuit blocks and connecting the plurality of circuit portions within the corresponding one circuit block,
wherein a first circuit block having a plurality of first circuit portions and a second circuit block having a plurality of second circuit portions are included in the plurality of circuit blocks,
wherein the interblock connection portion electrically connects the first circuit block and the second circuit block and has a resistance adjusting portion that increases a resistance value in a current path from the first circuit block to a second circuit portion, among the plurality of second circuit portions, arranged closest to the first circuit block,
wherein the plurality of intrablock connection portions include a first intrablock connection portion connected to a third circuit block among the plurality of circuit blocks and a second intrablock connection portion connected to a fourth circuit block among the plurality of circuit blocks,
wherein each of the first intrablock connection portion and the second intrablock connection portion includes:
a plate portion;
a plurality of connection ends protruding from the plate portion and connected to the plurality of circuit portions; and
an external connection end protruding from the plate portion and provided on an opposite side of the plate portion with respect to the plurality of connection ends, and
wherein the external connection end of the first intrablock connection portion is arranged on a side of the plate portion of the first intrablock connection portion closer to the fourth circuit block, and
wherein the external connection end of the second intrablock connection portion is arranged on a side of the plate portion of the second intrablock connection portion farther away from the third circuit block.

20. The semiconductor device according to claim 19, wherein
the plurality of circuit portions are arranged side by side in a first direction,
the interblock connection portion includes:
a plate portion; and
an external connection end protruding from the plate portion of the interblock connection portion, and
the external connection end of the first intrablock connection portion, the external connection end of the second intrablock connection portion, and the external connection end of the interblock connection portion are arranged side by side in the first direction.

* * * * *